(12) United States Patent
Lee

(10) Patent No.: US 11,925,068 B2
(45) Date of Patent: Mar. 5, 2024

(54) DISPLAY DEVICE

(71) Applicant: SAMSUNG DISPLAY CO., LTD., Yongin-si (KR)

(72) Inventor: Hyeonbum Lee, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 438 days.

(21) Appl. No.: 16/998,305

(22) Filed: Aug. 20, 2020

(65) Prior Publication Data

US 2021/0249486 A1    Aug. 12, 2021

(30) Foreign Application Priority Data

Feb. 11, 2020 (KR) .................. 10-2020-0016635

(51) Int. Cl.
| | |
|---|---|
| H10K 59/122 | (2023.01) |
| H10K 50/80 | (2023.01) |
| H10K 50/86 | (2023.01) |
| H10K 59/12 | (2023.01) |
| H10K 59/121 | (2023.01) |
| H10K 59/124 | (2023.01) |
| H10K 59/126 | (2023.01) |
| H10K 59/131 | (2023.01) |
| H10K 59/35 | (2023.01) |
| H10K 59/38 | (2023.01) |
| H10K 59/88 | (2023.01) |

(52) U.S. Cl.
CPC ......... H10K 59/122 (2023.02); H10K 59/126 (2023.02)

(58) Field of Classification Search
CPC ........ H01L 27/3211–27/3218; H01L 27/3246; H01L 27/3272; H10K 59/124; H10K 59/131; H10K 59/88
See application file for complete search history.

(56) References Cited

U.S. PATENT DOCUMENTS

| 7,915,613 B2 | 3/2011 | Park | |
|---|---|---|---|
| 9,570,527 B2 | 2/2017 | Namkung | |
| 2006/0061525 A1* | 3/2006 | Kim | ...... H10K 59/131 345/76 |
| 2014/0353030 A1* | 12/2014 | Burstner | ........ H01B 1/026 428/673 |

(Continued)

FOREIGN PATENT DOCUMENTS

| KR | 101318307 B1 | 10/2013 |
|---|---|---|
| KR | 1020150003572 A | 1/2015 |

(Continued)

*Primary Examiner* — Mohsen Ahmadi
(74) *Attorney, Agent, or Firm* — CANTOR COLBURN LLP

(57) ABSTRACT

A display device includes: a substrate including a display area and a non-display area outside the display area; a planarization layer over the substrate, where a first contact hole, a second contact hole and a dummy hole are defined through the planarization layer; a first pixel on the planarization layer and including a first pixel electrode, where the first pixel electrode overlaps the first contact hole and the dummy hole; and a second pixel on the planarization layer and including a second pixel electrode, where the second pixel electrode overlaps the second contact hole.

20 Claims, 18 Drawing Sheets

(56) References Cited

U.S. PATENT DOCUMENTS

| | | | | |
|---|---|---|---|---|
| 2015/0001477 A1* | 1/2015 | Namkung | ............ | H10K 59/124 |
| | | | | 257/40 |
| 2015/0194634 A1* | 7/2015 | Kang | ................ | H01L 51/5268 |
| | | | | 257/40 |
| 2016/0291380 A1* | 10/2016 | Hong | ................ | G02F 1/13454 |
| 2016/0307981 A1* | 10/2016 | Jung | ................ | H10K 59/1213 |
| 2016/0321993 A1* | 11/2016 | Choi | .................... | H10K 59/131 |
| 2017/0033171 A1* | 2/2017 | Kim | ..................... | G09G 3/3233 |
| 2017/0317145 A1 | 11/2017 | Hong et al. | | |
| 2018/0069068 A1* | 3/2018 | Ka | ...................... | H10K 59/1213 |
| 2018/0097053 A1* | 4/2018 | Park | ...................... | H01L 27/124 |
| 2018/0130856 A1* | 5/2018 | Kim | ..................... | H10K 59/131 |
| 2018/0182827 A1 | 6/2018 | Kim | | |
| 2018/0240822 A1* | 8/2018 | Lee | ...................... | H01L 27/1255 |
| 2019/0035864 A1* | 1/2019 | Liu | .................... | G02F 1/13394 |
| 2019/0035867 A1* | 1/2019 | Choung | ............. | H01L 27/3246 |
| 2019/0245017 A1* | 8/2019 | Jeon | ..................... | H10K 50/865 |
| 2020/0004370 A1* | 1/2020 | Matsueda | ............ | G06F 3/0446 |
| 2020/0089369 A1* | 3/2020 | Bang | ..................... | G06F 3/0446 |
| 2020/0227489 A1* | 7/2020 | Kim | ................... | H01L 51/5275 |
| 2021/0165515 A1* | 6/2021 | Song | ..................... | G06F 3/0412 |
| 2021/0241671 A1* | 8/2021 | Lee | ..................... | G09G 3/3225 |

FOREIGN PATENT DOCUMENTS

| | | | |
|---|---|---|---|
| KR | 1020160038182 A | | 4/2016 |
| KR | 1020180075958 A | | 7/2018 |
| KR | 101919554 B1 | | 11/2018 |

\* cited by examiner

DISPLAY DEVICE

This application claims priority to Korean Patent Application No. 10-2020-0016635, filed on Feb. 11, 2020, and all the benefits accruing therefrom under 35 U.S.C. § 119, the content of which in its entirety is herein incorporated by reference.

BACKGROUND

1. Field

One or more embodiments relate to a display device, and more particularly, to a display device in which a color separation caused by reflected light is reduced.

2. Description of Related Art

Generally, a display device may be used under various environments. Therefore, a display device may be used under an ambient light environment. Particularly, when a display device is a mobile apparatus, there is a high possibility that the mobile apparatuses are used under an environment where there is external light in an outdoor space.

SUMMARY

However, in a conventional display device, as external light is reflected by the display device, a color band may be viewed.

One or more embodiments include a display device which may reduce a degree of occurrence of a color band caused by external light reflection.

According to an embodiment, a display device includes a substrate including a display area and a non-display area outside the display area, a planarization layer over the substrate, where a first contact hole, a second contact hole and a dummy hole are defined through the planarization layer, a first pixel on the planarization layer and including a first pixel electrode, where the first pixel electrode overlaps the first contact hole and the dummy hole, and a second pixel on the planarization layer and including a second pixel electrode, where the second pixel electrode overlaps the second contact hole.

In an embodiment, the first pixel electrode and the second pixel electrode may be inclined in a same direction as each other.

In an embodiment, the display device may further include a pixel-defining layer on the first pixel electrode, wherein a first opening is defined through the pixel-defining layer to expose at least a portion of the first pixel electrode, and the first contact hole and the dummy hole may be apart from each other with the first opening of the pixel-defining layer therebetween.

In an embodiment, the dummy hole may overlap the pixel-defining layer.

In an embodiment, the pixel-defining layer may include a light-blocking material.

In an embodiment, the planarization layer may include a first planarization layer and a second planarization layer, and the first contact hole may be defined in the first planarization layer and the second planarization layer.

In an embodiment, the dummy hole may be defined in the first planarization layer and the second planarization layer.

In an embodiment, the dummy hole may be defined in only the second planarization layer.

In an embodiment, the first planarization layer and the second planarization layer may include different materials from each other.

In an embodiment, the display device may further include a first thin film transistor and a second thin film transistor, each of which is over the substrate, where the first thin film transistor may be connected to the first pixel electrode through the first contact hole, and the second thin film transistor may be connected to the second pixel electrode through the second contact hole.

In an embodiment, the first pixel may further include a first intermediate layer on the first pixel electrode, the second pixel may further include a second intermediate layer on the second pixel electrode, one of the first intermediate layer and the second intermediate layer emits light in a green wavelength, and the other of the first intermediate layer and the second intermediate layer emits light in a red or blue wavelength.

In an embodiment, the first intermediate layer may emit light in the blue or red wavelength, and the second intermediate layer may emit light in the green wavelength.

In an embodiment, the display device may further include a light-blocking layer overlapping the pixel-defining layer, where a second opening is defined through the light-blocking layer, the light-blocking layer may be apart from the dummy hole by a first distance, and the first distance may be defined as a shortest distance between an inner surface of the second opening and the dummy hole.

According to an embodiment, a display device includes a first thin film transistor and a second thin film transistor, each of which is over a substrate, a planarization layer over the substrate, where a first contact hole, a second contact hole and a dummy hole are defined through the planarization layer, a first pixel electrode on the planarization layer, overlapping the dummy hole, and connected to the first thin film transistor through the first contact hole, and a second pixel electrode on the planarization layer and connected to the second thin film transistor through the second contact hole.

In an embodiment, the first pixel electrode and the second pixel electrode may be inclined in a same direction as each other.

In an embodiment, the display device may further include a pixel-defining layer on the first pixel electrode and the second pixel electrode, where an opening is defined through the pixel-defining layer to expose at least a portion of the first pixel electrode and the second pixel electrode, and the first contact hole may be apart from the dummy hole with the opening of the pixel-defining layer therebetween.

In an embodiment, the planarization layer may include a first planarization layer and a second planarization layer, and the first contact hole may be defined in the first planarization layer and the second planarization layer.

In an embodiment, the dummy hole may be defined in the first planarization layer and the second planarization layer.

In an embodiment, the dummy hole may be defined in only the second planarization layer.

In an embodiment, the display device may further include a first intermediate layer and a second intermediate layer, which are on the first pixel electrode and the second pixel electrode, respectively, and an opposite electrode covering the first intermediate layer and the second intermediate layer, where one of the first intermediate layer and the second intermediate layer emits light in a green wavelength, and the other of the first intermediate layer and the second intermediate layer emits light in a red or blue wavelength.

These and/or other features of embodiments of the invention will become apparent and more readily appreciated from the following description of the embodiments, the accompanying drawings, and claims.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
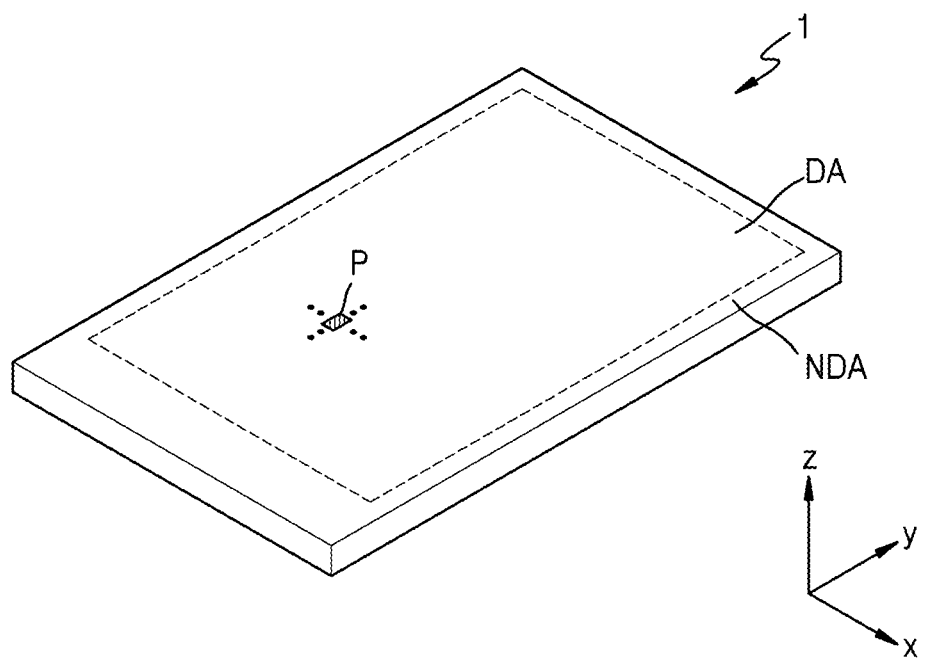
FIG. 1 is a perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. As used herein, "at least one of A and B" means A or B, or A and B. Throughout the disclosure, the expression "at least one of a, b or c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when a wiring is referred to as "extending in a first direction or a second direction", it means that the wiring not only extends in a straight line shape but also extends in a zigzag or in a curve in the first direction or the second direction.

As used herein, "on a plan view" means that an objective portion is viewed from above, and "on a cross-sectional view" means that a cross-section of an objective portion taken vertically is viewed from a lateral side. As used herein, "overlapping" includes overlapping "in a plan view" and "in a cross-sectional view."

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure are described in detail with reference to the accompanying drawings.

FIG. 1 is a perspective view of a display device 1 according to an embodiment.

Referring to FIG. 1, an embodiment of the display device 1 includes a display area DA and a non-display area NDA outside the display area DA. The non-display area NDA may surround the display area DA. The display device 1 may display an image by using light emitted from a plurality of pixels P arranged in the display area DA. The non-display area NDA may include a region on which an image is not displayed.

Hereinafter, for convenience of description, embodiments where the display device 1 is an organic light-emitting display device will be described in detail, but the display device 1 is not limited thereto. In an alternative embodiment, the display device 1 may be another types of display device such as inorganic light-emitting displays or quantum dot light-emitting displays. In one embodiment, for example, an emission layer of a display element of the display device 1 may include an organic material, an inorganic material, quantum dots, an organic material and quantum dots, or an inorganic material and quantum dots.

FIG. 1 shows an embodiment where the display device 1 has a flat display surface, but the embodiment is not limited thereto. In an alternative embodiment, the display device 1 may include a three-dimensional display surface or a curved display surface.

In an embodiment where the display device 1 includes a three-dimensional display surface, the display device 1 may include a plurality of display areas indicating different directions, for example, include a polyprism-type display surface. In an embodiment, where the display device 1 includes a curved display surface, the display device 1 may be implemented in various forms such as flexible, foldable, or rollable display devices.

FIG. 1 shows an embodiment where the display device 1 is a mobile phone terminal. Though not shown, in such an embodiment, electronic modules, a camera module, a power module, etc. mounted on a main board may be arranged on a bracket/case together with the display device 1, so that a mobile phone terminal may be configured. In an embodiment, the display device 1 is applicable to small and medium-scale electronic apparatuses such as tablet personal computers, automobile navigation apparatuses, and game consoles, smartwatches as well as large-scale electronic apparatuses such as televisions, monitors, etc.

FIG. 1 shows an embodiment where the display area DA of the display device 1 is quadrangular, but not being limited thereto. Alternatively, the display area DA may have a circular or elliptical shape, or a polygonal shape such as a triangle or a pentagon.

Figure 2:
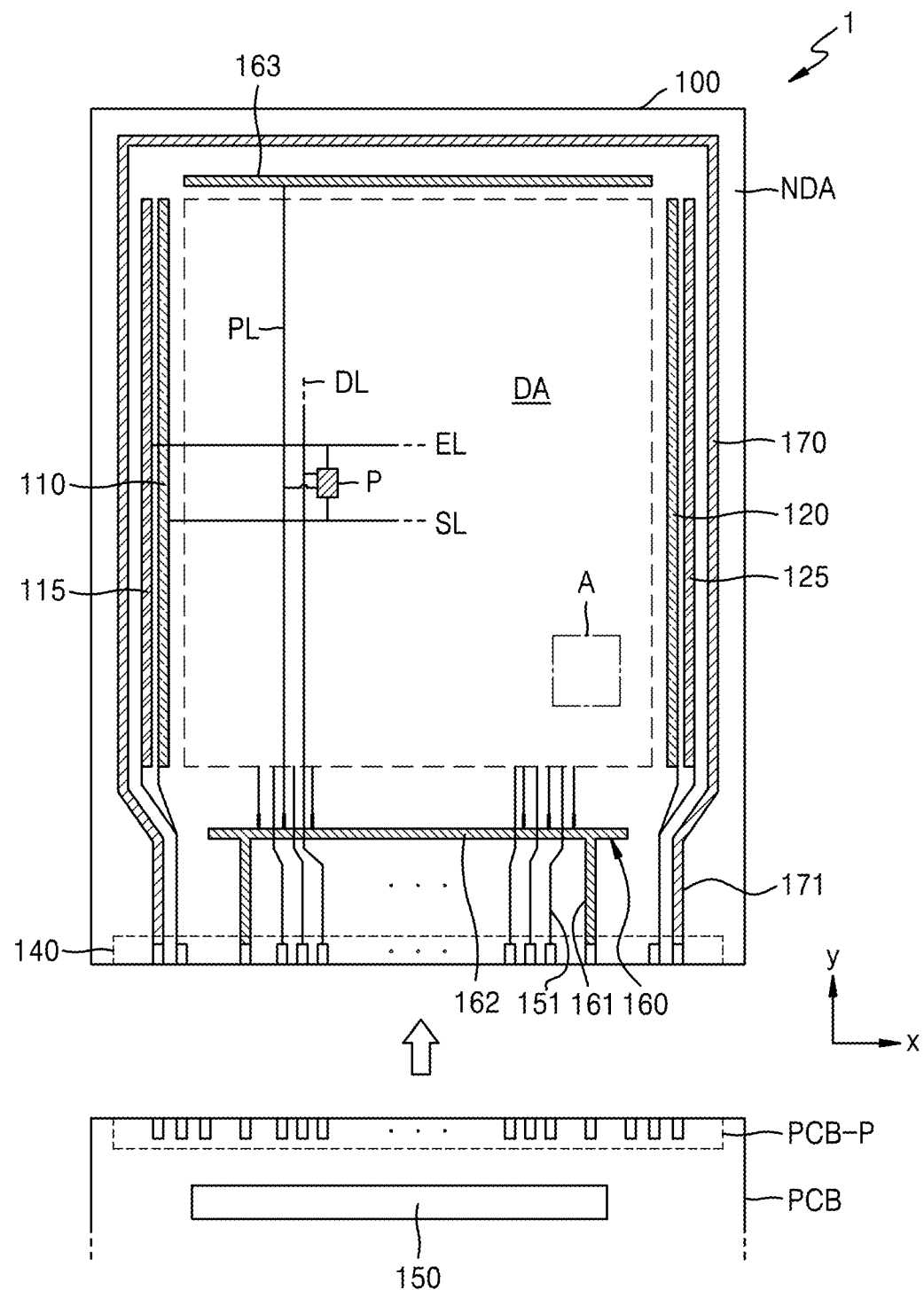
FIG. 2 is a plan view of a display device according to an embodiment.

FIG. 2 is a plan view of the display device 1 according to an embodiment.

Referring to FIG. 2, an embodiment of the display device 1 includes a plurality of pixels P arranged in the display area DA. Each of the plurality of pixels P may include a display element such as an organic light-emitting diode OLED. Each of the plurality of pixels P may emit, for example, red, green, blue, or white light from the organic light-emitting diode OLED. In an embodiment as described above, a pixel P of the display device 1 may include a pixel that emits red, green, blue, or white light, i.e., a red pixel, a green pixel, a blue pixel or a white pixel.

Each pixel P may be electrically connected to outer circuits arranged in the non-display area NDA. A first scan driving circuit 110, a first emission driving circuit 115, a second scan driving circuit 120, a second emission driving circuit 125, a terminal 140, a data driving circuit 150, a first power supply line 160, and a second power supply line 170 may be arranged in the non-display area NDA.

The first scan driving circuit 110 may provide a scan signal to each pixel P through a scan line SL. The first emission driving circuit 115 may provide an emission control signal to each pixel P through an emission control line EL. The second scan driving circuit 120 may be arranged in parallel to the first scan driving circuit 110 with the display area DA therebetween. Some pixels of the pixels P arranged in the display area DA may be electrically connected to the first scan driving circuit 110, and the remaining pixels of the pixels P may be electrically connected to the second scan driving circuit 120. The second emission driving circuit 125 may be arranged in parallel to the first emission driving circuit 115 with the display area DA therebetween. Some pixels of the pixels P arranged in the display area DA may be electrically connected to the first emission driving circuit 115, and the remaining pixels of the pixels P may be electrically connected to the second emission driving circuit 125.

In an embodiment, the first emission driving circuit 115 may be apart from the first scan driving circuit 110 in an x-direction and arranged in the non-display area DNA. In such an embodiment, the first emission driving circuit 115 may be alternately arranged with the first scan driving circuit 110 in a y-direction.

In an embodiment, the second emission driving circuit 125 may be apart from the second scan driving circuit 120 in the x-direction and arranged in the non-display area NDA. In such an embodiment, the second emission driving circuit 125 may be alternately arranged with the second scan driving circuit 120 in the y-direction.

The terminal 140 may be arranged on one side or edge portion of a substrate 100. The terminal 140 may be exposed by not being covered by an insulating layer and electrically connected to a printed circuit board PCB. A terminal PCB-P of the printed circuit board PCB may be electrically connected to the terminal 140 of the display device 1. The printed circuit board PCB transfers a signal or power of a controller (not shown) to the display device 1. A control signal generated by the controller may be transferred to the first scan driving circuit 110, the first emission driving circuit 115, the second scan driving circuit 120, and the second emission driving circuit 125 through the printed circuit board PCB. The controller may respectively provide a first power voltage ELVDD (also referred to as a driving voltage) and a second power voltage ELVSS (also referred to as a common voltage) to the first power supply line 160 and the second power supply line 170 through a first connection line 161 and a second connection line 171. The first power voltage ELVDD may be provided to a pixel P through the driving voltage line PL connected to the first power supply line 160, and the second power voltage ELVSS may be provided to an opposite electrode of a pixel P connected to the second power supply line 170.

In an embodiment of the display device 1, a data driving circuit 150 is electrically connected to a data line DL. A data signal of the data driving circuit 150 may be provided to each pixel P through a connection line 151 and the data line DL, the connection line 151 connected to the terminal 140, and the data line DL connected to the connection line 151.

In an embodiment, as shown in FIG. 2, the data driving circuit 150 may be arranged on the printed circuit board PCB, but not being limited thereto. Alternatively, the data driving circuit 150 may be arranged on the substrate 100. In one embodiment, for example, the data driving circuit 150 may be arranged between the terminal 140 and the first power supply line 160.

The first power supply line 160 may include a first sub-line 162 and a second sub-line 163 extending in parallel to each other in the x-direction with the display area DA therebetween. The second power supply line 170 may have a loop shape having one open side and partially surround the display area DA.

Figure 3:
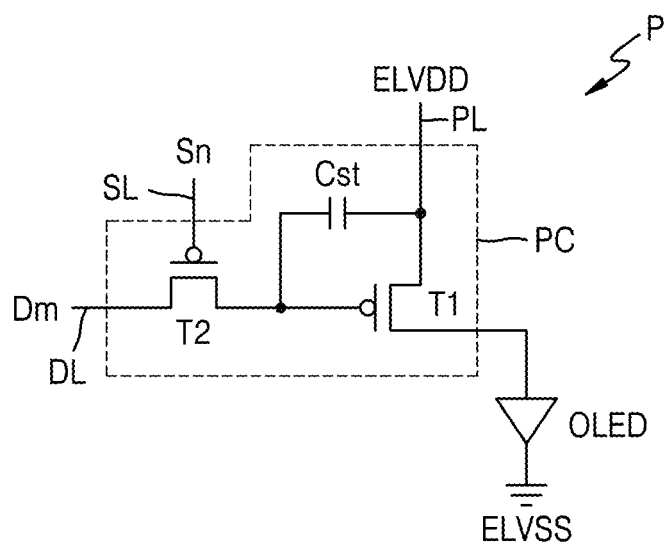
FIGS. 3 and 4 are equivalent circuit diagrams of a pixel in a display device according to embodiments.
Figure 4:
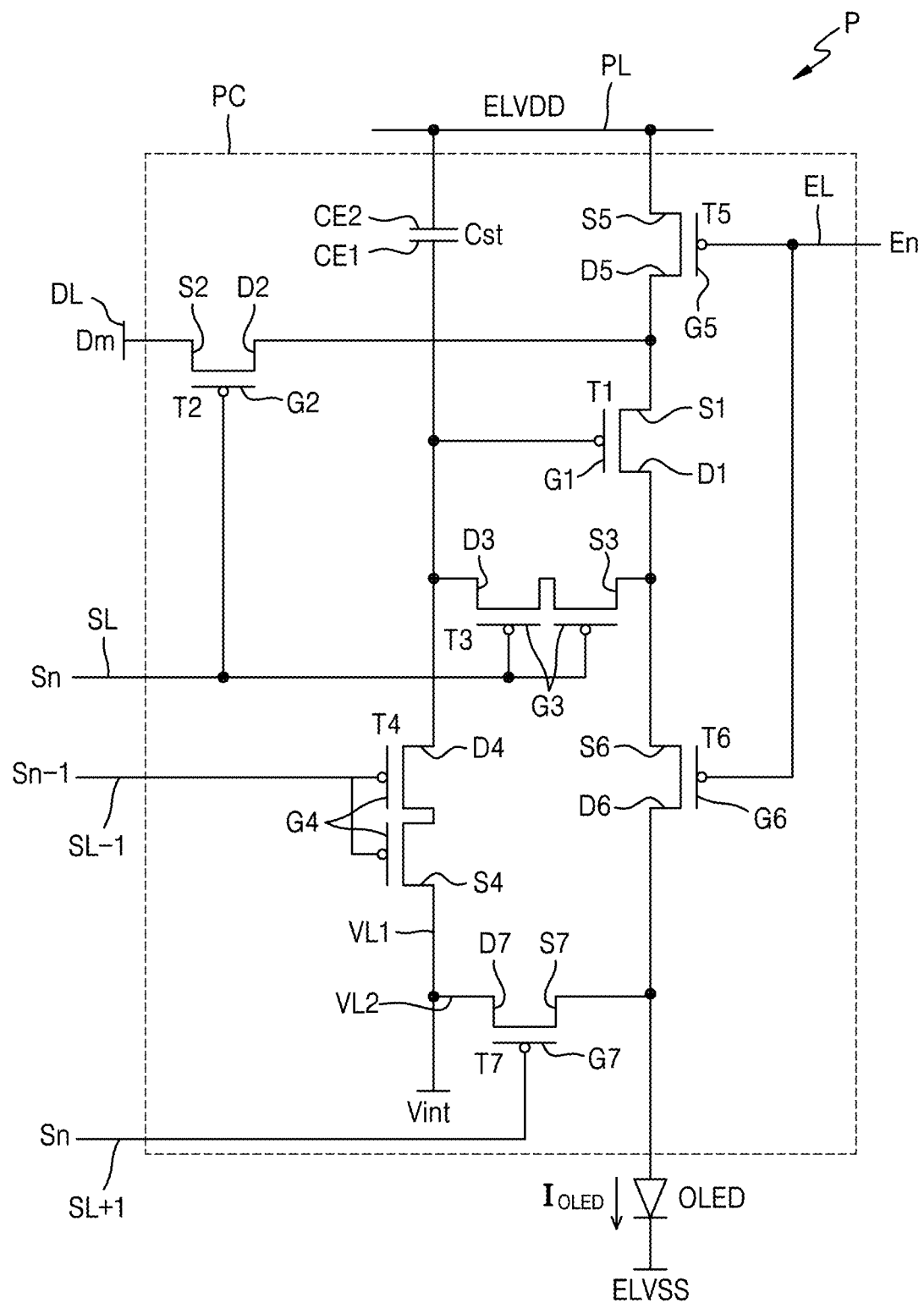

FIGS. 3 and 4 are equivalent circuit diagrams of a pixel in the display device according to embodiments.

Referring to FIG. 3, an embodiment of a pixel P includes a pixel circuit PC and an organic light-emitting diode OLED, where the pixel circuit PC is connected to the scan line SL and the data line DL, and the organic light-emitting diode OLED is connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal Dm input through the data line DL to the driving thin film transistor T1 based on a scan signal Sn input through the scan line SL.

The storage capacitor Cst is connected to the switching thin film transistor T2 and the driving voltage line PL and stores a voltage corresponding to a difference between a voltage transferred from the switching thin film transistor T2 and the first power voltage ELVDD (or the driving voltage) supplied to the driving voltage line PL.

The driving thin film transistor T1 is connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a brightness corresponding to the driving current.

In an embodiment, as shown in FIG. 3, the pixel circuit PC includes two thin film transistors and a single storage capacitor, but the embodiment is not limited thereto. In an alternative embodiment, as shown in FIG. 4, the pixel circuit PC may include seven thin film transistors and a single storage capacitor.

Referring to FIG. 4, an embodiment of a pixel P includes the pixel circuit PC and the organic light-emitting diode OLED, the organic light-emitting diode OLED being electrically connected to the pixel circuit PC. The pixel circuit PC may include a plurality of thin film transistors T1, T2, T3, T4, T5, T6, and T7 and the storage capacitor Cst. The plurality of thin film transistors T1, T2, T3, T4, T5, T6, and T7 and the storage capacitor Cst may be connected to signal lines SL, SL−1, SL+1, EL, and DL, a first initialization voltage line VL1, a second initialization voltage line VL2, and the driving voltage line PL.

The signal lines SL, SL−1, SL+1, EL, and DL may include a scan line SL, a previous scan line SL−1, a next scan line SL+1, an emission control line EL, and a data line DL. In such an embodiment, the scan line SL may transfer a scan signal Sn, the previous scan line SL−1 may transfer a previous scan signal Sn−1 to the first initialization thin film transistor T4, the next scan line SL+1 may transfer a scan signal Sn to the second initialization thin film transistor T7, the emission control line EL may transfer an emission control signal to the operation control thin film transistor T5 and the emission control thin film transistor T6, and the data line DL intersecting with the scan line SL may transfer a data signal Dm. The driving voltage line PL may transfer the driving voltage ELVDD to the driving thin film transistor T1, the first initialization voltage line VL1 may transfer an initialization voltage Vint to the first initialization thin film transistor T4, and the second initialization voltage line VL2 may transfer the initialization voltage Vint to the second initialization thin film transistor T7.

A driving gate electrode G1 of the driving thin film transistor T1 is connected to a bottom electrode CE1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to a pixel electrode of an organic light-emitting diode OLED through the emission control thin film transistor T6. The driving thin film transistor T1 receives a data signal Dm based on a switching operation of the switching thin film transistor T2 and supplies a driving current $I_{OLED}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source region S1 of the driving thin film transistor T1 and simultaneously connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and simultaneously connected to the pixel electrode of the organic light-emitting diode OLED through the emission control thin film transistor T6, and a compensation drain electrode D3 of the compensation thin film transistor T3 is connected to the bottom electrode CE1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and diode-connects the driving thin film transistor T1 by electrically connecting the driving gate electrode G1 of the driving thin film transistor T1 to the driving drain electrode D1 of the driving thin film transistor T1.

A first initialization gate electrode G4 of the first initialization thin film transistor T4 is connected to the previous scan line SL−1, a first initialization source electrode S4 of the first initialization thin film transistor T4 is connected to the first initialization voltage line VL1, and a first initialization drain electrode D4 of the first initialization thin film transistor T4 is connected to the bottom electrode CE1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn−1 transferred through the previous scan line SL−1 and performs an initialization operation of initializing a voltage of the gate electrode G1 of the driving thin film transistor T1 by transferring the initialization voltage Vint to the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1, and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to the second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL, the driving voltage ELVDD is transferred to the organic light-emitting diode OLED, and the driving current $I_{OLED}$ flows through the organic light-emitting diode OLED.

A second initialization gate electrode G7 of the second initialization thin film transistor T7 is connected to the next scan line SL+1, a second initialization source electrode S7 of the second initialization thin film transistor T7 is connected to the emission control drain electrode D6 of the emission control thin film transistor T6 and the pixel electrode of the organic light-emitting diode OLED, and a second initialization drain electrode D7 of the second initialization thin film transistor T7 is connected to the second initialization voltage line VL2.

In such an embodiment where the scan line SL is electrically connected to the next scan line SL+1, a same scan signal Sn may be applied to the scan line SL and the next scan line SL+1. Therefore, the second initialization thin film transistor T7 may be turned on in response to a scan signal Sn transferred through the next scan line SL+1 and may perform an operation of initializing the pixel electrode of the organic light-emitting diode OLED.

In such an embodiment, a top electrode CE2 of the storage capacitor Cst is connected to the driving voltage line PL, and a common electrode of the organic light-emitting diode OLED is connected to the common voltage ELVSS. Therefore, the organic light-emitting diode OLED may display an image by receiving the driving current $I_{OLED}$ from the driving thin film transistor T1 and emitting light.

In an embodiment, as shown in FIG. 4, the compensation thin film transistor T3 and the first initialization thin film transistor T4 may each have a dual gate electrode, but not being limited thereto. Alternatively, the compensation thin film transistor T3 and the first initialization thin film transistor T4 may each have a single gate electrode.

Figure 5:
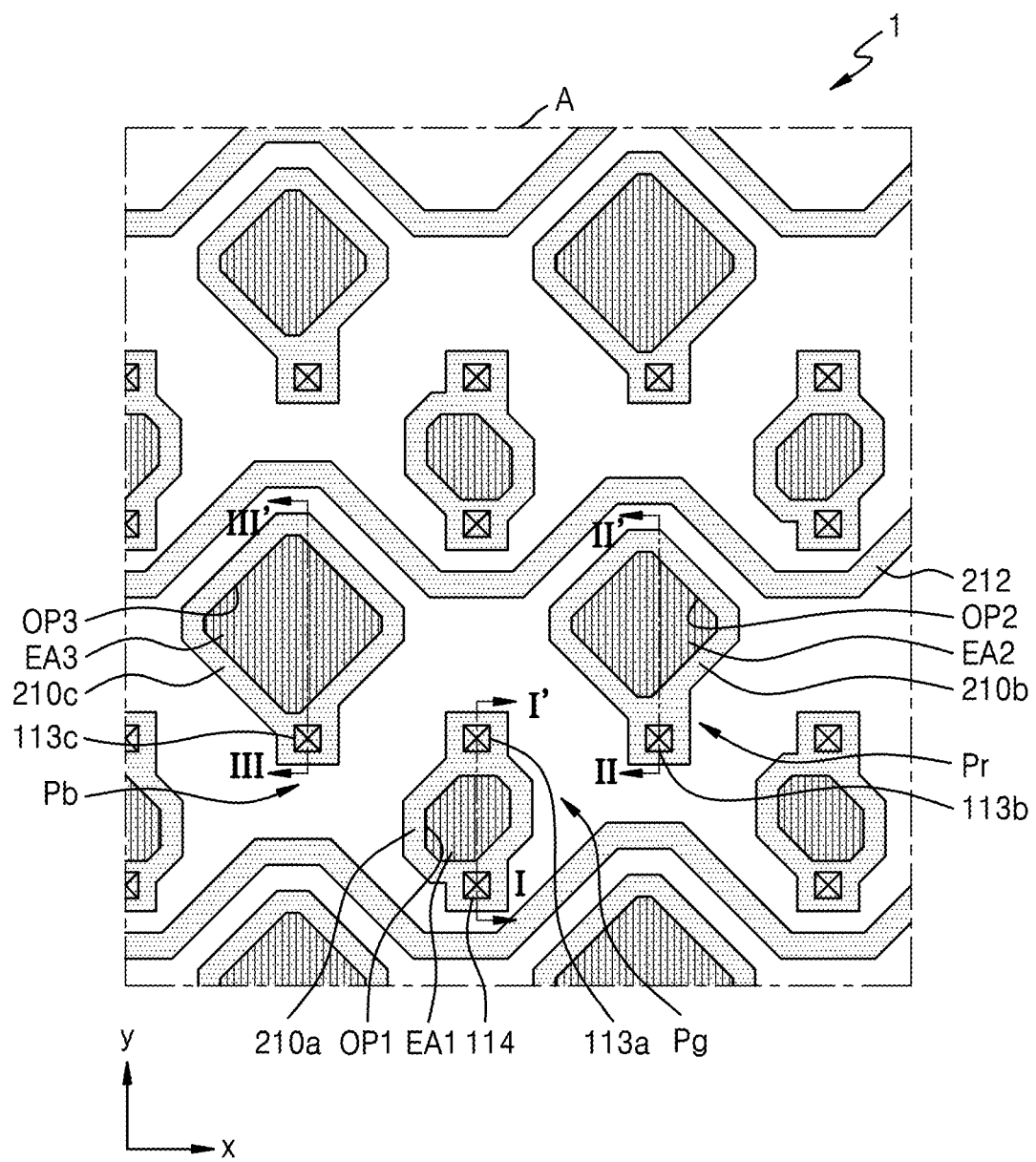
FIG. 5 is a plan view of a display device according to an embodiment.
Figure 6:
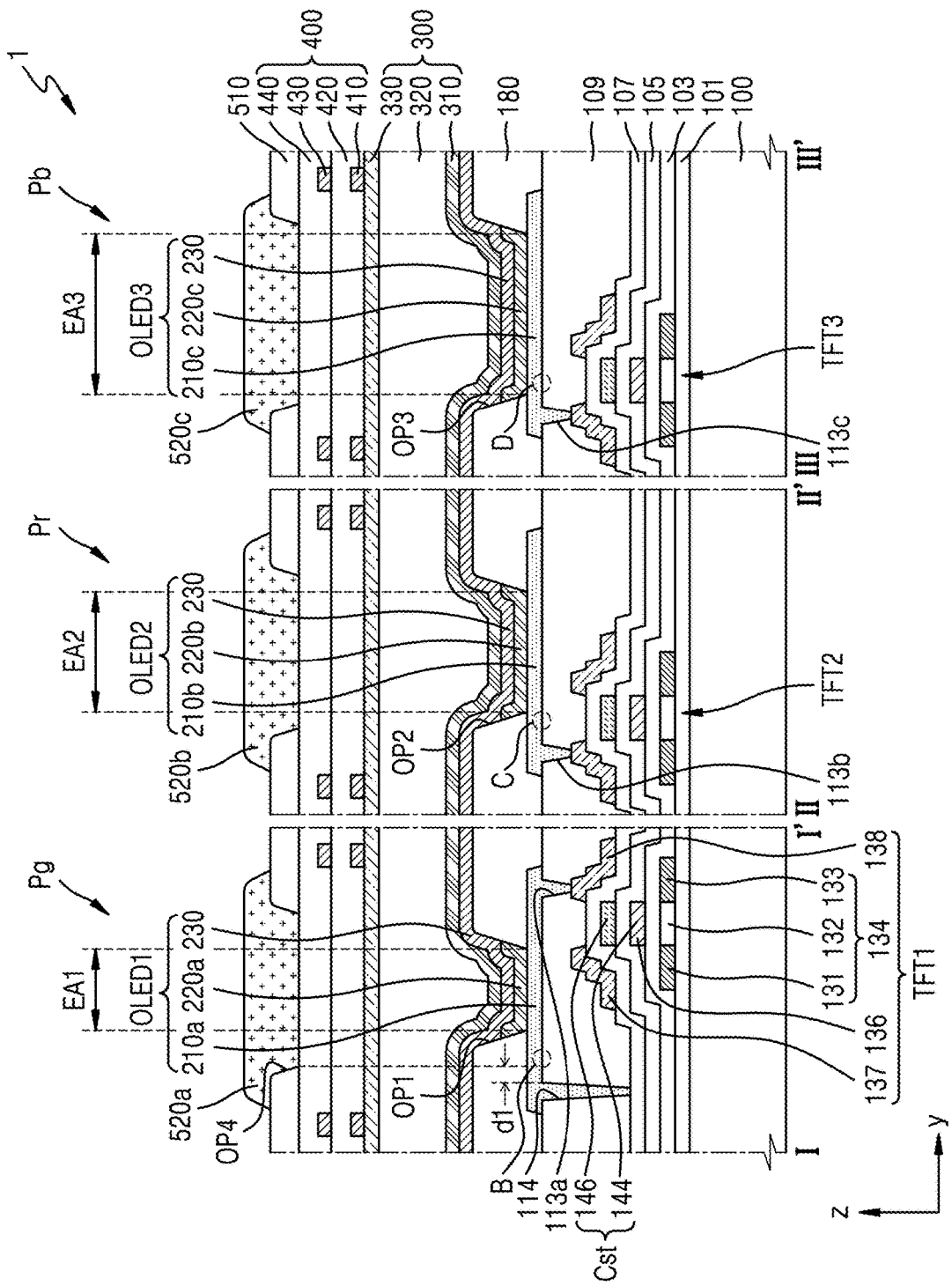
FIG. 6 is a cross-sectional view of a display device according to an embodiment.
Figure 7A:
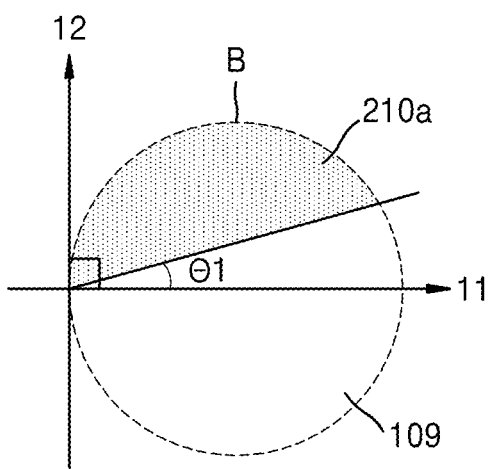
FIGS. 7A to 7C are diagrams of a display device according to an embodiment.
Figure 7B:
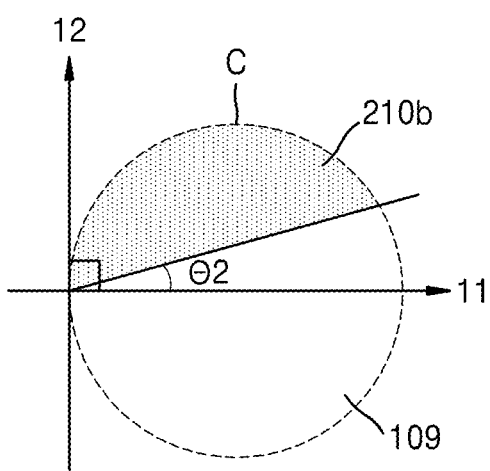
Figure 7C:
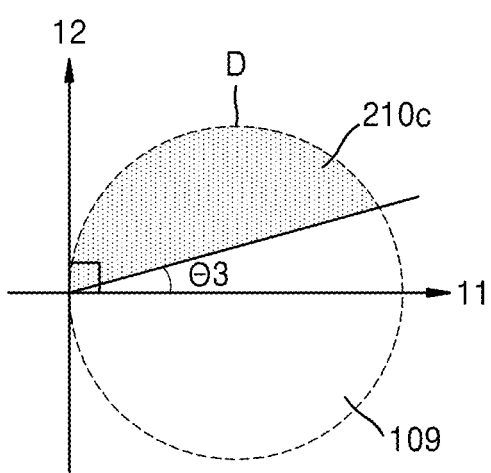

FIG. 5 is a plan view of the display device 1 according to an embodiment, FIG. 6 is a cross-sectional view of the display device 1 according to an embodiment, and FIGS. 7A to 7C are diagrams of the display device according to an embodiment.

More specifically, FIG. 5 is an enlarged view of a region A of FIG. 2, FIG. 6 is a cross-sectional view of the display device, taken along lines I-I', II-II', and III-III' of FIG. 5, and FIGS. 7A to 7C are enlarged views of regions B to D of FIG. 6.

Referring to FIGS. 5 and 6, an embodiment of the display device 1 may include a green pixel Pg, a red pixel Pg, and a blue pixel Pb. In such an embodiment, the green pixel Pg emits light having a green wavelength, the red pixel Pg emits light having a red wavelength, and the blue pixel Pb emits light having a blue wavelength. In an embodiment of FIG. 5, the green pixel Pg may define a first pixel, the red pixel Pr and the blue pixel Pb may define a second pixel.

An embodiment of the display device 1 may include a planarization layer, the green pixel Pg, and the red pixel Pr. In such an embodiment, the planarization layer may be arranged over the substrate 100, a first contact hole 113a, a second contact hole 113b, and a dummy hole 114 are defined through the planarization layer, the green pixel Pg is arranged on the planarization layer and includes a first pixel electrode 210a overlapping the first contact hole 113a and the dummy hole 114, and the red pixel Pr is arranged on the planarization layer and includes a second pixel electrode 210b that overlaps the second contact hole 113b.

In an embodiment, the display device 1 may further include the blue pixel Pb arranged on the planarization layer and including a third pixel electrode 210c overlapping a third contact hole 113c.

In an embodiment, the substrate 100 may include glass or a polymer resin. In such an embodiment, the polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the polymer resin and an inorganic layer (not shown).

In an embodiment of the display device 1, a buffer layer 101 may be arranged on the substrate 100. The buffer layer 101 may be located on the substrate 100, may reduce or block the penetration of foreign substances, moisture, or external air from below the substrate 100, and provide a flat surface on the substrate 100. The buffer layer 101 may include an inorganic material such as an oxide or a nitride, or an organic material, or an organic/inorganic composite material and include a single layer or a multi-layer including the inorganic material and the organic material.

In an embodiment of the display device 1, a first thin film transistor TFT1, a second thin film transistor TFT2, and a third thin film transistor TFT3 may be arranged on the buffer layer 101. Each thin film transistor may include a semiconductor layer 134, a gate electrode 136, a source electrode 137, and a drain electrode 138, the source electrode 137 serving as a connection electrode.

The first to third thin film transistors TFT1, TFT2, and TFT3 may be respectively and electrically connected to first to third organic light-emitting diodes OLED1, OLED2, and OLED3 described below to drive the first to third organic light-emitting diodes OLED1, OLED2, and OLED3.

The semiconductor layer 134 is arranged on the buffer layer 101 and may include a channel region 132, a source region 131, and a drain region 133. In such an embodiment, the channel region 132 may overlap the gate electrode 136, and the source region 131 and the drain region 133 may be arranged on two opposite sides of the channel region 132 and include impurities having a concentration higher than that of the channel region 132. Here, the impurities may include N-type impurities or P-type impurities. Though not shown, the source region 131 and the drain region 133 may be electrically connected to the connection electrode.

The semiconductor layer 134 may include an oxide semiconductor and/or a silicon semiconductor. In an embodiment where the semiconductor layer 134 includes an oxide semiconductor, the semiconductor layer 134 may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). In one embodiment, for example, the semiconductor layer 134 may include at least one selected from InSnZnO ("ITZO"), InGaZnO ("IGZO"), etc. In an embodiment where the semiconductor layer 134 includes a silicon semiconductor, the semiconductor layer 134 may include amorphous silicon ("a-Si") or low temperature polycrystalline silicon ("LTPS") formed by crystallizing a-Si.

In an embodiment of the display device 1, a first insulating layer 103 may be arranged on the semiconductor layer 134. The first insulating layer 103 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may be a single layer or a multi-layer including the above inorganic insulating materials.

The gate electrode 136 may be arranged on the first insulating layer 103. The gate electrode 136 may be a single layer or a multi-layer including at least one metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line applying an electric signal to the gate electrode 136.

In an embodiment of the display device 1, a second insulating layer 105 may be arranged on the gate electrode 136. The second insulating layer 105 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may be a single layer or a multi-layer including the above inorganic insulating materials.

The storage capacitor Cst may be arranged on the first insulating layer 103. The storage capacitor Cst may include a bottom electrode 144 and a top electrode 146 overlapping the bottom electrode 144. The bottom electrode 144 of the storage capacitor Cst may overlap the gate electrode 136 of the thin film transistor TFT, and the bottom electrode 144 of the storage capacitor Cst may be integrally formed as a single unitary body with the gate electrode 136 of the thin film transistor TFT. In an embodiment, the storage capacitor Cst may not overlap the thin film transistor TFT and may be a separate element independent from the gate electrode 136 of the thin film transistor TFT.

The top electrode 146 of the storage capacitor Cst may include at least one selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W) and copper (Cu), and be a single layer or a multi-layer including the above materials.

In an embodiment of the display device 1, a third insulating layer 107 may be arranged on the top electrode 146. The third insulating layer 107 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 107 may be a single layer or a multi-layer including the above inorganic insulating materials.

The source electrode 137, which is the connection electrode, and the drain electrode 138 may be arranged on the third insulating layer 107. The source electrode 137 and the drain electrode 138 may include a conductive material including molybdenum (Mo), aluminum (Al), copper (Cu), and titanium (Ti) and may be a single layer or a multi-layer including the above materials. In one embodiment, for example, the source electrode 137 and the drain electrode 138 may have a multi-layered structure of Ti/Al/Ti.

In an embodiment of the display device 1, a first planarization layer 109 may be arranged on the source electrode 137 and the drain electrode 138. The first contact hole 113a, the second contact hole 113b, the third contact hole 113c, and the dummy hole 114 may be defined in the first planarization layer 109. The first planarization layer 109 may be a single layer or a multi-layer including an organic material or an inorganic material. In an embodiment, the first planarization layer 109 may include a general-purpose polymer such as benzocyclobutene ("BCB"), polyimide ("PI"), hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The first planarization layer 109 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In one embodiment, for example, the first planarization layer 109 may include a siloxane-based polymer material or PI.

In an embodiment of the display device 1, a first organic light-emitting diode OLED1, a second organic light-emitting diode OLED2, and a third organic light-emitting diode OLED3 may be arranged on the first planarization layer 109. In such an embodiment, the first organic light-emitting diode OLED1 may include a first pixel electrode 210a, a first intermediate layer 220a and an opposite electrode 230, the second organic light-emitting diode OLED2 may include a second pixel electrode 210b, a second intermediate layer 220b and the opposite electrode 230, and the third organic light-emitting diode OLED3 may include a third pixel electrode 210c, a third intermediate layer 220c and the opposite electrode 230.

The first thin film transistor TFT1 may be connected to the first pixel electrode 210a through the first contact hole 113a to drive the first organic light-emitting diode OLED1, the second thin film transistor TFT2 may be connected to the second pixel electrode 210b through the second contact hole 113b to drive the second organic light-emitting diode OLED2, and the third thin film transistor TFT3 may be connected to the third pixel electrode 210c through the third contact hole 113c to drive the third organic light-emitting diode OLED3.

The first pixel electrode 210a, the second pixel electrode 210b, and the third pixel electrode 210c may be arranged on the first planarization layer 109. The first pixel electrode 210a, the second pixel electrode 210b, and the third pixel electrode 210c may be apart from each other and may be disposed in a same layer as each other.

Each of the first pixel electrode 210a, the second pixel electrode 210b, and the third pixel electrode 210c may include a (semi) transparent electrode or a reflective electrode. In one embodiment, for example, the first pixel electrode 210a, the second pixel electrode 210b, and the third pixel electrode 210c may include a reflective layer and a transparent or semi-transparent electrode layer on the reflective layer. In such an embodiment, the reflective layer may include at least one selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), copper (Cu), and a compound thereof. The transparent or semi-transparent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). Each of the first pixel electrode 210a, the second pixel electrode 210b, and the third pixel electrode 210c may have a stacked structure of ITO/Ag/ITO.

In an embodiment of the display device 1, a shielding member 212 may be further arranged on the first planarization layer 109. In an embodiment, as shown in FIG. 5, the shielding member 212 may extend in the x-direction along a portion of the edges of the first pixel electrode 210a, the second pixel electrode 210b, and the third pixel electrode 210c not to overlap the first pixel electrode 210a, the second pixel electrode 210b and the third pixel electrode 210c on a plan view, and may be arranged above or below each row. The shielding member 212 may extend in a straight line or in a zigzag depending on the arrangement of the first pixel electrode 210a, the second pixel electrode 210b, and the third pixel electrode 210c on the same row. The shielding member 212 may include a metal having a light-blocking characteristic. In one embodiment, for example, the shielding member 212 may include at least one selected from aluminum (Al), copper (Cu), and titanium (Ti), and may be a single layer or a multi-layer including the above materials. In one embodiment, for example, the shielding member 212 may be a multi-layer of Ti/Al/Ti. The shielding member 212 may include a same material as that of the first pixel electrode 210a, the second pixel electrode 210b, and the third pixel electrode 210c. The shielding members 212 may be apart from each other and provided independently for each row. The shielding members 212 may be floated and electrically connected to a constant voltage wiring (e.g. a power voltage line, an initialization voltage line, etc.) to receive a constant voltage therefrom.

In an embodiment of the display device 1, a pixel-defining layer 180 may be arranged on the first planarization layer 109. The pixel-defining layer 180 may overlap the first contact hole 113a, the second contact hole 113b, the third contact hole 113c and the dummy hole 114, which are defined in the first planarization layer 109 and arranged on the first planarization layer 109.

In an embodiment, a first opening OP1 that exposes at least a portion of the first pixel electrode 210a is defined through the pixel-defining layer 180. A region exposed by the pixel-defining layer 180 may be defined as a first emission area EA1. Surroundings of the first emission area EA1 is a non-emission area, and the non-emission area may surround the first emission area EA1.

A second opening OP2 that exposes at least a portion of the second pixel electrode 210b is defined through the pixel-defining layer 180. A region exposed by the pixel-defining layer 180 may be defined as a second emission area EA2. Surroundings of the second emission area EA2 is a non-emission area, and the non-emission area may surround the second emission area EA2.

A third opening OP3 that exposes at least a portion of the third pixel electrode 210c is defined through the pixel-defining layer 180. A region exposed by the pixel-defining layer 180 may be defined as a third emission area EA3. Surroundings of the third emission area EA3 is a non-emission area, and the non-emission area may surround the third emission area EA3.

The pixel-defining layer 180 may prevent an arc, etc., from occurring at the edges of the first pixel electrode 210a, the second pixel electrode 210b, and the third pixel electrode 210c by increasing a distance between the edges of the first pixel electrode 210a, the second pixel electrode 210b, and the third pixel electrode 210c and the opposite electrode 230. The pixel-defining layer 180 may include, for example, an organic insulating material including PI, polyamide, an acrylic resin, BCB, HMDSO, and a phenolic resin and be formed by a spin coating.

In an embodiment, the pixel-defining layer 180 may include a black matrix which includes a light-blocking material. The black matrix may include at least one selected from various materials, for example, an organic material mixing a black pigment, chrome (Cr) or chrome oxide ($CrO_x$). In an embodiment where the black matrix includes chrome (Cr) or chrome oxide ($CrO_x$), the black matrix may be a single layer or a multi-layer including chrome (Cr) or chrome oxide ($CrO_x$).

The first contact hole 113a and the dummy hole 114 defined in the first planarization layer 109 may be apart from each other with the first opening OP1 of the pixel-defining layer 180 therebetween. In one embodiment, for example, as shown in FIG. 5, the first contact hole 113a and the dummy hole 114 may be apart from each other in the y-direction with the first opening OP1 of the pixel-defining layer 180 therebetween.

The first thin film transistor TFT1 may be connected to the first pixel electrode 210a on the first planarization layer 109 through the first contact hole 113a defined in the first planarization layer 109, the second thin film transistor TFT2 may be connected to the second pixel electrode 210b on the first planarization layer 109 through the second contact hole 113b defined in the first planarization layer 109, and the third thin film transistor TFT3 may be connected to the third pixel electrode 210c on the first planarization layer 109 through the third contact hole 113c defined in the first planarization layer 109.

The contact hole defined in the planarization layer is formed by entirely forming the planarization layer and then patterning the planarization layer using a mask. A height of a portion of the planarization layer in which the contact hole is patterned is less than a height of other portions. Therefore, the pixel electrode on the planarization layer may be inclined on one side. In an embodiment, as shown in FIG. 5, in a green pixel Pg, a contact hole is defined in a top portion of the pixel electrode in a plan view. In a red pixel Pr and a blue pixel Pb, a contact hole is defined in a bottom portion of the pixel electrode in a plan view. Therefore, the pixel electrode of the green pixel Pg and the pixel electrodes of the red pixel Pr and the blue pixel Pb are inclined in different directions, and accordingly, a color band caused by external light reflection may occur.

In an embodiment of the invention, the color band caused by external light reflection may be effectively prevented from occurring by including the dummy hole in the planarization layer and thus making the same the directions in which the pixel electrode of the green pixel Pg, and the pixel electrodes of the red pixel Pr and the blue pixel Pb are inclined.

To make the direction in which the pixel electrode of the green pixel Pg is inclined coincide with the directions in which the pixel electrodes of the red pixel Pr and the blue pixel Pb are inclined, the first planarization layer 109 of the display device 1 may include the dummy hole 114 overlapping the pixel electrode of the green pixel Pg.

Referring to FIGS. 7A to 7C, in an embodiment, the first planarization layer 109 includes the dummy hole 114, such that a height of the first planarization layer 109 that neighbors a portion of the first planarization layer 109 in which the dummy hole 114 is patterned becomes less than a height of a portion of the first planarization layer 109 in which the first contact hole 113a is patterned. Therefore, the first pixel electrode 210a of the green pixel Pg is inclined in the same direction as the directions in which the second pixel electrode 210b of the red pixel Pr and the third pixel electrode 210c of the blue pixel Pb are inclined, and thus occurrence of a color band caused by external light reflection may be effectively prevented.

More specifically, the first pixel electrode 210a of the green pixel Pg may form a first slope angle θ1 to a z-direction with respect to a first axis 11 on a second axis 12 on a plane including the first axis 11 and the second axis 12, the first axis 11 extending in the y-direction and the second axis 12 extending in the z-direction intersecting with the y-direction. The first pixel electrode 210a may be arranged on the first planarization layer 109. The second pixel 210b of the red pixel Pr may form a second slope angle θ2 to the z-direction with respect to the first axis 11 on the plane including the first axis 11 and the second axis 12. The second pixel 210b may be arranged on the first planarization layer 109. The third pixel electrode 210c of the blue pixel Pb may form a third slope angle θ3 to the z-direction with respect to the first axis 11 on the plane including the first axis 11 and the second axis 12. The third pixel 210c may be arranged on the first planarization layer 109. In an embodiment, the first slope angle θ1, the second slope angle θ2, and the third slope angle θ3 may have an angle in a range from about 0° to about 3°, have an angle in a range from about 0° to about 2°, or have an angle in a range from about 0° to about 1.5°. In such an embodiment, various modifications may be made. In one embodiment, for example, the first slope angle θ1, the second slope angle θ2, and the third slope angle θ3 may have a slope angle in a range from about 0° to about 1°.

In such an embodiment, the first pixel electrode 210a of the green pixel Pg, the second pixel electrode 210b of the red pixel Pr, and the third pixel electrode 210c of the blue pixel Pb have a slope angle in a same direction (that is, is inclined in a same direction), such that occurrence of a color band caused by external light reflection may be effectively prevented.

Referring back to FIG. 6, the first intermediate layer 220a may be arranged on at least a portion of the first pixel electrode 210a that is exposed by the pixel-defining layer 180, the second intermediate layer 220b may be arranged on at least a portion of the second pixel electrode 210b that is exposed by the pixel-defining layer 180, and the third intermediate layer 220c may be arranged on at least a portion of the third pixel electrode 210c that is exposed by the pixel-defining layer 180.

The first intermediate layer 220a, the second intermediate layer 220b and the third intermediate layer 220c may each include an emission layer. A first functional layer and a second functional layer may be selectively arranged on and under the emission layer.

The first functional layer may include a hole injection layer and/or a hole transport layer, and the second functional layer may include an electron transport layer and/or an electron injection layer. The emission layer may include an organic material including a fluorescent or phosphorous material emitting red, green, blue, or white light. The emission layer may include a low molecular weight organic material or a polymer organic material.

In an embodiment where the emission layer includes a low molecular weight organic material, the first intermediate layer 220a, the second intermediate layer 220b, and the third intermediate layer 220c may have a structure in which a hole injection layer, a hole transport layer, an emission layer, an electron transport layer, an electron injection layer, etc. are stacked in a single or composite configuration. The emission layer may include at least one selected from various organic materials such as copper phthalocyanine ("CuPc"), N, N'-Di (naphthalene-1-yl)-N, N'-diphenyl-benzidine ("NPB"), and tris-8-hydroxyquinoline aluminum ("Alq3"). These layers may be formed by a vacuum deposition.

In an embodiment where the emission layer includes a polymer organic material, the first intermediate layer 220a, the second intermediate layer 220b, and the third intermediate layer 220c may have a structure generally including a hole transport layer and an emission layer. In such an embodiment, the hole transport layer may include poly-3, 4-ethylenedioxythiophene ("PEDOT"), and the emission layer may include a polymer material such as a polyphenylene vinylene ("PPV")-based material and a polyfluorene-based material. The emission layer may be formed by a screen printing, an inkjet printing method, or a laser induced thermal imaging ("LITI").

In an embodiment, the first intermediate layer 220a of the green pixel Pg may emit light in a green wavelength, the second intermediate layer 220b of the red pixel Pr may emit light in a red wavelength, and the third intermediate layer 220c of the blue pixel Pb may emit light in a blue wavelength, The opposite electrode 230 may be arranged on the first intermediate layer 220a, the second intermediate layer 220b, and the third intermediate layer 220c. The opposite electrode 230 may be arranged to entirely cover the first intermediate layer 220a, the second intermediate layer 220b, and the third intermediate layer 220c. The opposite electrode 230 may be arranged in the display area DA and arranged to entirely cover the display area DA. In an embodiment, the opposite electrode 230 may be formed, by using an open mask, as a single unitary body over an entire display panel to cover a plurality of pixels P arranged in the display area DA. The opposite electrode 230 may include a conductive material having a low work function. In one embodiment, for example, the opposite electrode 230 may include a (semi) transparent layer including at least one selected from silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), and an alloy thereof. Alternatively, the opposite electrode 230 may further include a layer including a layer including ITO, IZO, zinc oxide (ZnO), or indium oxide ($In_2O_3$) on the (semi) transparent layer including the above material.

In an embodiment of the display device 1, a thin-film encapsulation layer 300 may be arranged on the opposite electrode 230. The thin-film encapsulation layer 300 may include an inorganic encapsulation layer and an organic encapsulation layer. In an embodiment, the thin-film encapsulation layer 300 may include a first inorganic encapsulation layer 310, a second inorganic encapsulation layer 330, and an organic encapsulation layer 320 therebetween.

Each of the first inorganic encapsulation layer 310 and the second inorganic encapsulation layer 330 may include an inorganic insulating material. The inorganic insulating material may include at least one selected from aluminum oxide, titanium oxide, tantalum oxide, hafnium oxide, zinc oxide, silicon oxide, silicon nitride and silicon oxynitride. The organic encapsulation layer 320 may include a polymer-based material. The polymer-based material may include at least one selected from an acryl-based resin, an epoxy-based resin, polyimide, and polyethylene. In one embodiment, for example, the organic encapsulation layer 320 may include an acryl-based resin, e.g., PMMA or poly acrylic acid.

In an embodiment of the display device 1, a touch unit 400 may be arranged on the thin-film encapsulation layer 300. The touch unit 400 may be directly arranged on the thin-film encapsulation layer 300. The touch unit 400 may include a first conductive layer 410, a second conductive layer 430, a first touch insulating layer 420, and a second touch insulating layer 440. In such an embodiment, the second conductive layer 430 may be arranged on the first conductive layer 410, the first touch insulating layer 420 may be between the first conductive layer 410 and the second conductive layer 430, and the second touch insulating layer 440 may be arranged on the second conductive layer 430. At least one insulating layer may be further arranged between the thin-film encapsulation layer 300 and the first conductive layer 410.

The first conductive layer 410 and the second conductive layer 430 may include sensing electrodes and signal lines. In an embodiment, the first conductive layer 410 and the second conductive layer 430 may overlap the pixel-defining layer 180 to prevent a user from viewing the first conductive layer 410 and the second conductive layer 430 and may have a mesh shape.

The first conductive layer 410 and the second conductive layer 430 may have a single-layered structure or a stacked multi-layered structure. A conductive layer having a single-layered structure may include a metal layer or a transparent conductive layer. The metal layer may include at least one selected from molybdenum, silver, titanium, copper, aluminum, and an alloy thereof. The transparent conductive layer may include a transparent conductive oxide such as ITO, IZO, zinc oxide (ZnO), or indium tin zinc oxide (ITZO). In an embodiment, the transparent conductive layer may include a conductive polymer such as a PEDOT, a metal nano wire, and graphene. A conductive layer having a multi-layered structure may include multi-layered metal layers. The multi-layered metal layers may include a three-layered structure of Ti/Al/Ti. The conductive layer having a multi-layered structure may include a metal layer and a transparent conductive layer.

Each of the first touch insulating layer 420 and the second touch insulating layer 440 may have a single-layered structure or a multi-layered structure. Each of the first touch insulating layer 420 and the second touch insulating layer 440 may include an inorganic material, an organic material, or a composite material.

At least one of the first touch insulating layer 420 and the second touch insulating layer 440 may include an inorganic layer. The inorganic layer may include at least one selected from aluminum oxide, titanium oxide, silicon oxide, silicon oxynitride tantalum oxide, zirconium oxide, and hafnium oxide.

At least one of the first touch insulating layer 420 and the second touch insulating layer 440 may include an organic layer. The organic layer may include at least one selected from an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a parylene-based resin.

The touch unit 400 may sense an external input by using, for example, a capacitance method. In an embodiment, an operating method of the touch unit 400 is not particularly limited. An embodiment of the touch unit 400 may sense an external input by using electromagnetic induction or an input sensing method.

In an embodiment of the display device 1, a color filter layer may be arranged on the touch unit 400. The color filter layer may include a first color filter 520a, a second color filter 520b, and a third color filter 520c, the first color filter 520a overlapping the first pixel electrode 210a, the second color filter 520b overlapping the second pixel electrode 210b, and the third color filter 520c overlapping the third pixel electrode 210c. In an embodiment, a light-blocking layer 510 may be further included, and the light-blocking layer 510 may be arranged between the color filters.

The light-blocking layer 510 may be arranged on the touch unit 400. An opening (e.g. a fourth opening OP4) that exposes at least a portion of the touch unit 400 may be defined through the light-blocking layer 510. The fourth opening OP4 of the light-blocking layer 510 may overlap the first emission area EA1, the second emission area EA2, and the third emission area EA3 defined by the pixel-defining layer 180. That is, the light-blocking layer 510 may not overlap the first emission area EA1, the second emission area EA2, and the third emission area EA3 defined by the pixel-defining layer 180.

The light-blocking layer 510 may overlap the pixel-defining layer 180. The light-blocking layer 510 may include at least one selected from various materials, for example, an organic material mixing a black pigment, chrome (Cr), or chrome oxide ($CrO_x$). In an embodiment where the light-blocking layer 510 includes chrome or chrome oxide, the light-blocking layer 510 may be a single layer or a multi-layer of chrome (Cr) or chrome oxide ($CrO_x$). In an embodiment, the light-blocking layer 510 may include a same material as that of the pixel-defining layer 180.

The first color filter 520a, the second color filter 520b, and the third color filter 520c may be arranged in the fourth opening OP4 that exposes at least a portion of the touch unit 400. The first color filter 520a, the second color filter 520b, and the third color filter 520c may include an organic material pattern including pigment or dye. The first color filter 520a may selectively transmit light in a green wavelength, the second color filter 520b may selectively transmit light in a red wavelength, and the third color filter 520c may selectively transmit light in a blue wavelength. In one embodiment, for example, the first color filter 520a may be arranged to correspond to the first pixel electrode 210a, the second color filter 520b may be arranged to correspond to the second pixel electrode 210b, and the third color filter 520c may be arranged to correspond to the third pixel electrode 210c.

In an embodiment, the display device 1 may improve flexibility of the display device by using the light-blocking layer and the color filter instead of a polarizing plate.

The light-blocking layer 510 may overlap the dummy hole 114 defined in the first planarization layer 109. The light-blocking layer 510 may be apart from the dummy hole 114 by a first distance d1, where the first distance d1 is defined as a shortest distance between an inner surface of the opening (that is, the fourth opening OP4) formed in the light-blocking layer 510 and the dummy hole 114 defined in the first planarization layer 109. That is, when the dummy hole 114 and the light-blocking layer 510 are arranged on a same plane, the dummy hole 114 may be apart from the light-blocking layer 510 by the first distance d1, where the first distance d1 is defined as a shortest distance from an end of the light-blocking layer 510 to the dummy hole 114. In an embodiment, the first distance d1 may be about 5 micrometers (μm) or more, about 6 μm or more, or about 7 μm or more. Various modifications may be made. In one embodiment, for example, the first distance d1 may be about 5.5 μm or more.

In an embodiment, the display device 1 may include a first pixel and a second pixel. In such an embodiment, the first pixel may be arranged on the planarization layer and include the first pixel electrode overlapping the first contact hole and the dummy hole, and the second pixel may be arranged on the planarization layer and include the second pixel electrode overlapping the second contact hole. In one embodiment, for example, the first pixel may include the green pixel Pg, and the second pixel may include the red pixel Pr or the blue pixel Pb. Because the first pixel includes the first pixel electrode overlapping the dummy hole, a direction in which the first pixel electrode is inclined becomes the same as a direction in which the second pixel electrode is inclined, and thus occurrence of a color band caused by external light reflection may be effectively prevented.

Figure 8:
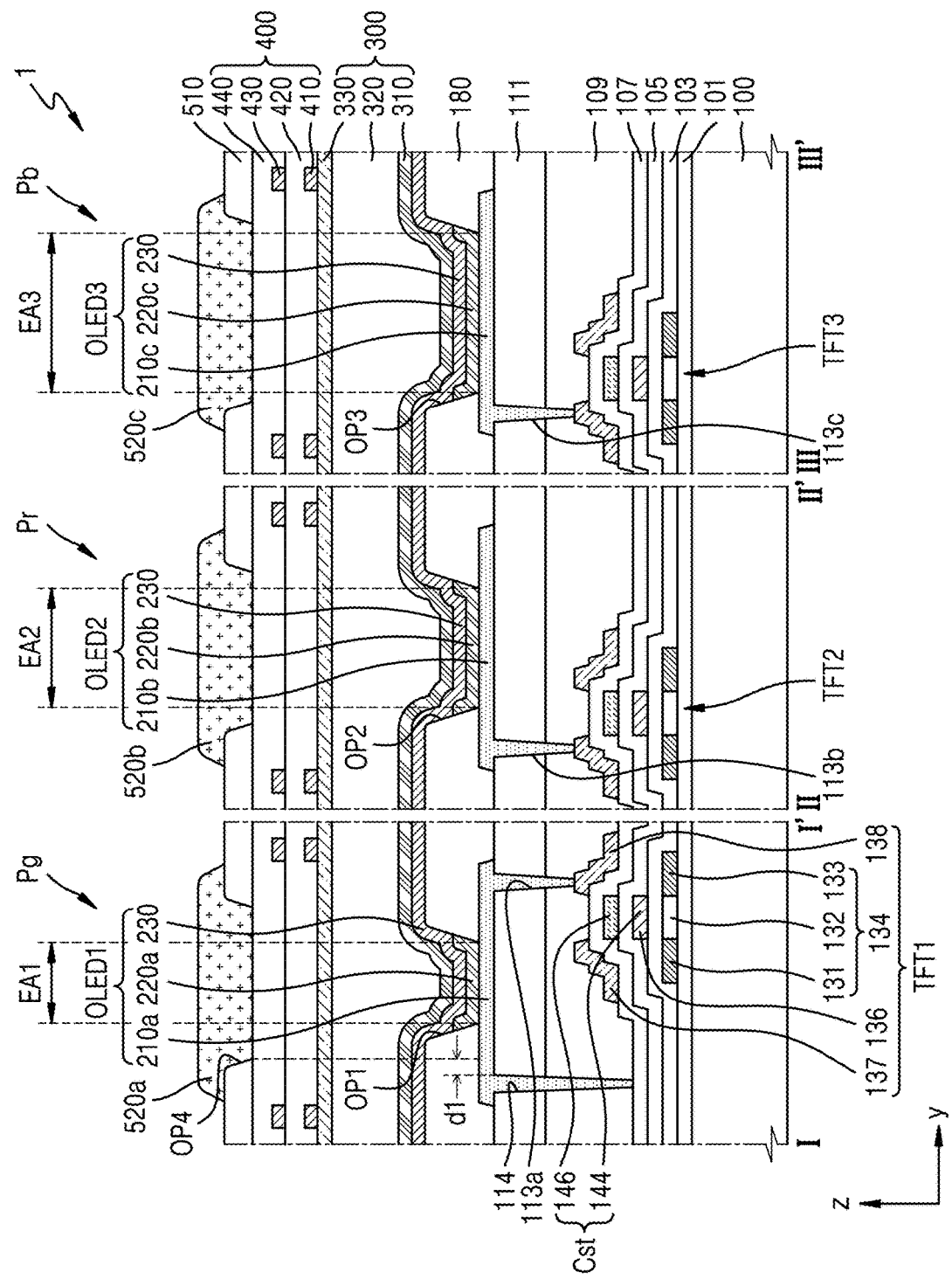
FIGS. 8 and 9 are cross-sectional views of a display device according to alternative embodiments.
Figure 9:
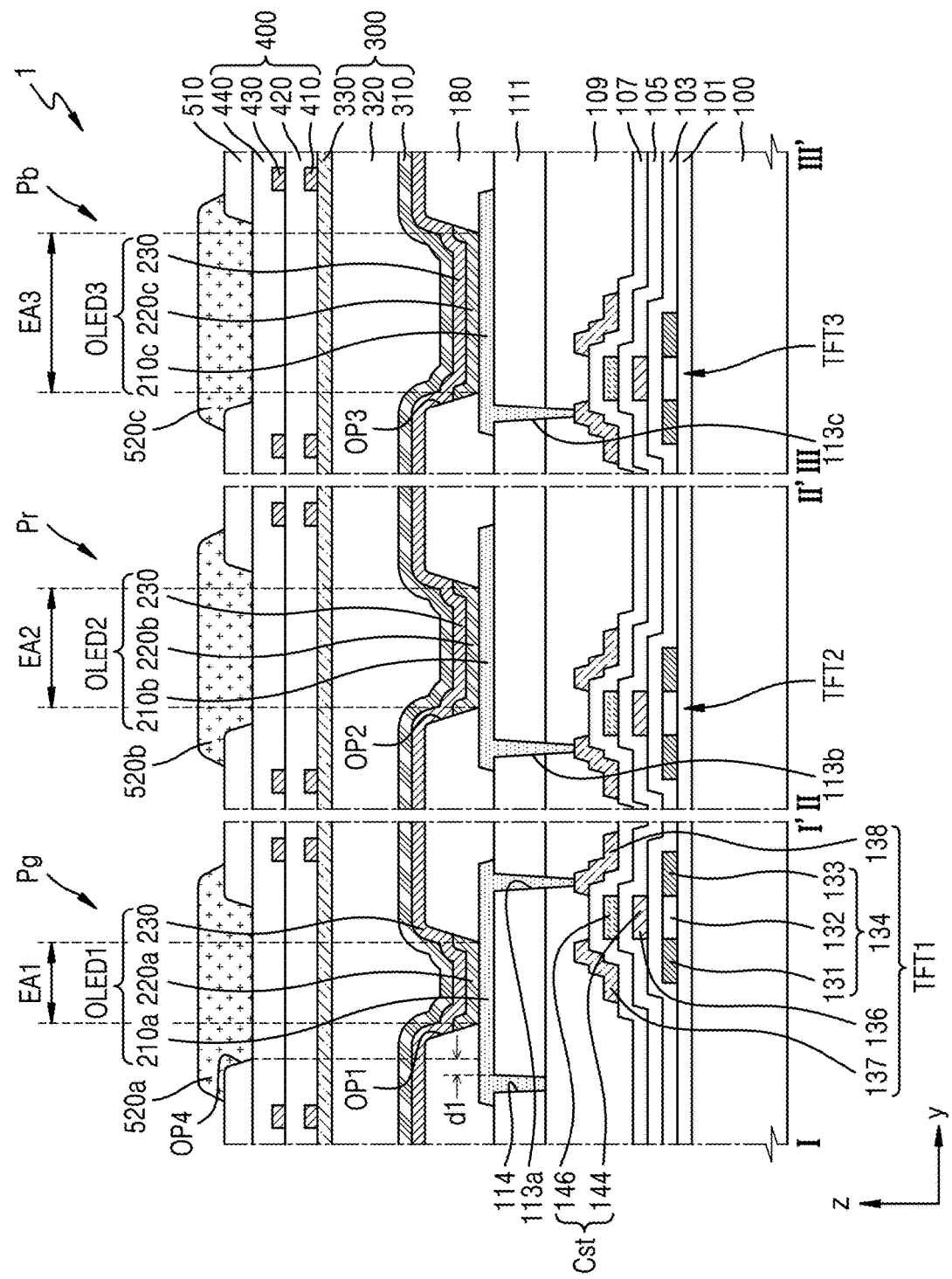

FIGS. 8 and 9 are cross-sectional views of the display device according to alternative embodiments.

The embodiments of FIGS. 8 and 9 are substantially the same as the embodiment of FIG. 6 except that a second planarization layer 111 is provided on the first planarization layer 109. The same or like elements shown in FIGS. 8 and 9 have been labeled with the same reference characters as used above to describe the embodiments of the display device shown in FIG. 6, and any repetitive detailed description thereof will hereinafter be omitted or simplified.

Referring to FIG. 8, an embodiment of the display device 1 may include the first planarization layer 109 and the second planarization layer 111.

The first planarization layer 109 may include a general-purpose polymer such as BCB, PI, HMDSO, PMMA or PS, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The first planarization layer 109 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The second planarization layer 111 may include a general-purpose polymer such as BCB, PI, HMDSO, PMMA or PS, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The second planarization layer 111 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

In an embodiment, the first planarization layer 109 may include a material different from that of the second planarization layer 111. In one embodiment, for example, the first planarization layer 109 may include a siloxane-based polymer material, and the second planarization layer 111 may include PI.

The first planarization layer 109 and the second planarization layer 111 may include a same material as each other. In one embodiment, for example, the first planarization layer 109 may include PI, and the second planarization layer 111 may include PI.

The first contact hole 113a, the second contact hole 113b, and the third contact hole 113c may be defined in the first planarization layer 109 and the second planarization layer 111. The first thin film transistor TFT1 may be connected to the first pixel electrode 210a of the first organic light-emitting diode OLED1 through the first contact hole 113a defined in the first planarization layer 109 and the second planarization layer 111. The second thin film transistor TFT2 may be connected to the second pixel electrode 210b of the second organic light-emitting diode OLED2 through the second contact hole 113b defined in the first planarization layer 109 and the second planarization layer 111. The third thin film transistor TFT3 may be connected to the third pixel electrode 210c of the third organic light-emitting diode OLED3 through the third contact hole 113c defined in the first planarization layer 109 and the second planarization layer 111.

The dummy hole 114 may be defined in the first planarization layer 109 and the second planarization layer 111 each overlapping the first pixel electrode 210a. In such an embodiment, the dummy hole 114 is provided in the first planarization layer 109 and the second planarization layer 111 each overlapping the first pixel electrode 210a, such that a direction in which the pixel electrode of the green pixel Pg is inclined becomes the same as directions in which the pixel electrodes of the red pixel Pr and the blue pixel Pb are inclined, and thus occurrence of a color band caused by external light reflection may be effectively prevented.

Referring to FIG. 9, an embodiment of the display device 1 may include the first planarization layer 109 and the second planarization layer 111.

The first planarization layer 109 may include a material different from that of the second planarization layer 111. In one embodiment, for example, the first planarization layer 109 may include a siloxane-based polymer material, and the second planarization layer 111 may include PI.

The first planarization layer 109 and the second planarization layer 111 may include a same material as each other. In one embodiment, for example, the first planarization layer 109 may include PI, and the second planarization layer 111 may include PI.

The dummy hole 114 may be defined in the second planarization layer 111 overlapping the first pixel electrode 210a. In such an embodiment, the dummy hole 114 is provided in the second planarization layer 111 overlapping the first pixel electrode 210a, such that a direction in which the pixel electrode of the green pixel Pg is inclined becomes the same as directions in which the pixel electrodes of the red pixel Pr and the blue pixel Pb are inclined, and thus occurrence of a color band caused by external light reflection may be effectively prevented. In such an embodiment, because the dummy hole 114 is provided in only the second planarization layer 111 overlapping the first pixel electrode 210a, the planarization layer may be effectively prevented from being lost and the display device 1 may have a more stable structure.

Figure 10:
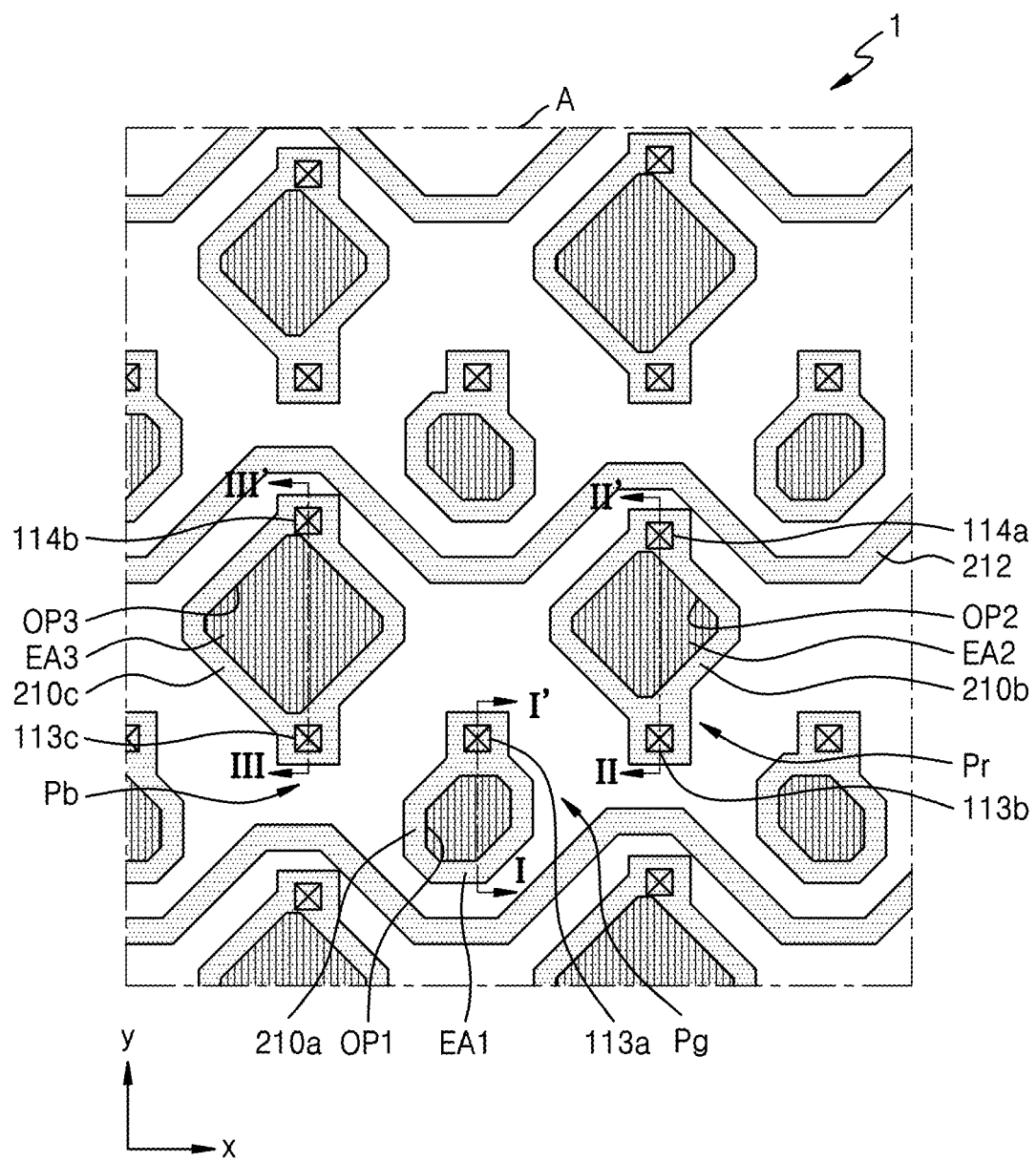
FIG. 10 is a plan view of a display device according to an alternative embodiment.
Figure 11:
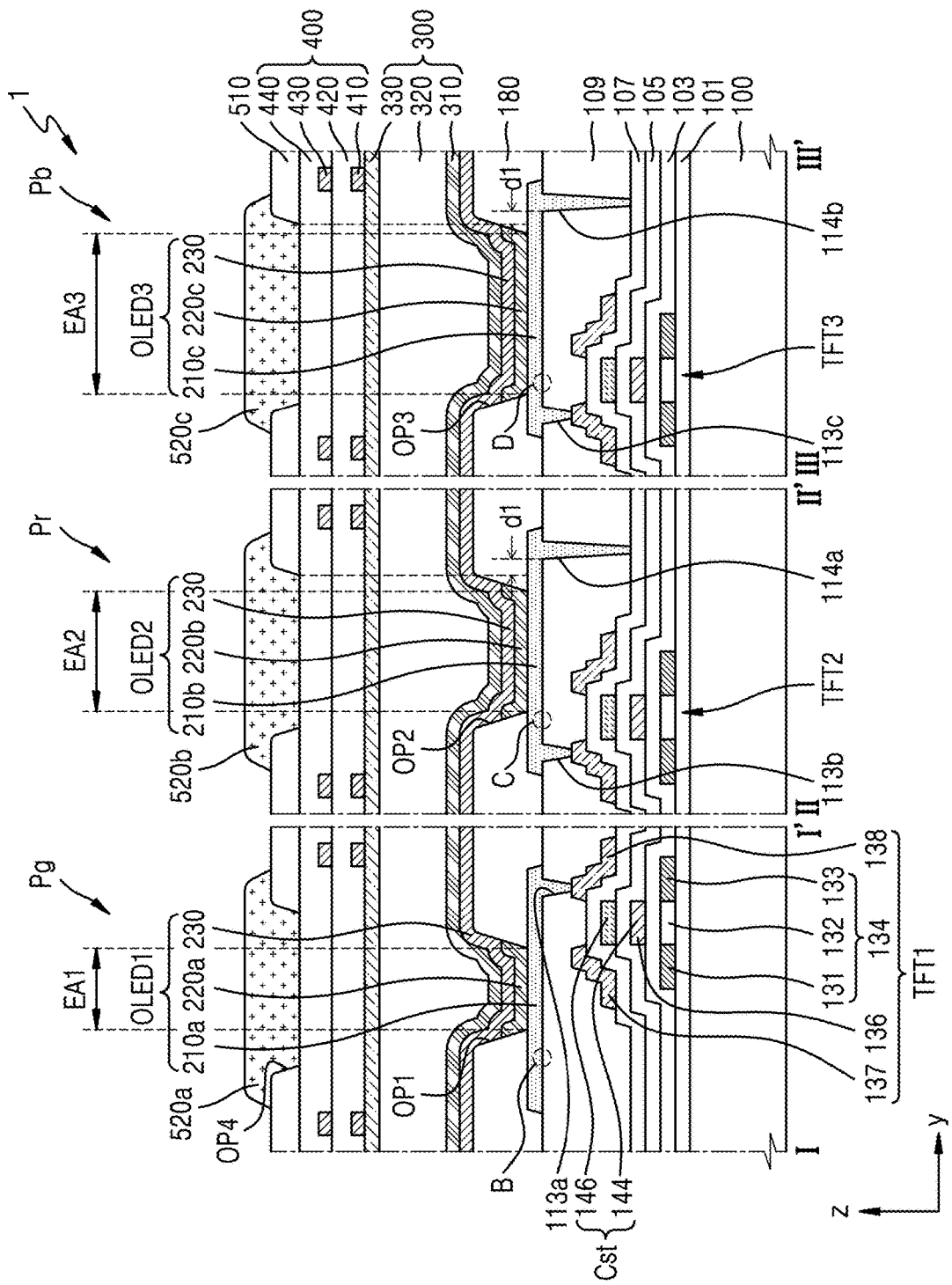
FIG. 11 is a cross-sectional view of a display device according to an embodiment.
Figure 12A:
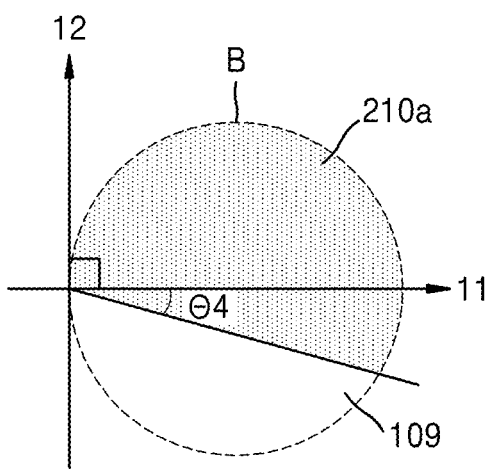
FIGS. 12A to 12C are plan views of a display device according to an embodiment.
Figure 12B:
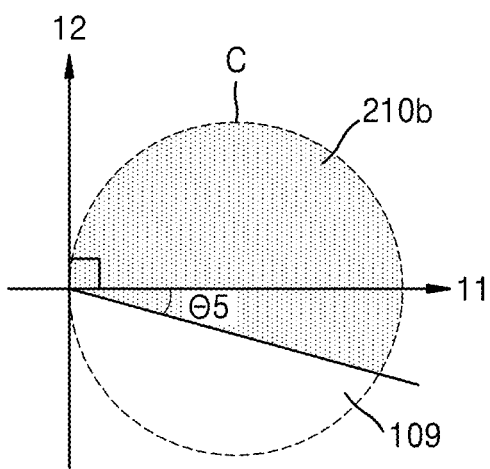
Figure 12C:
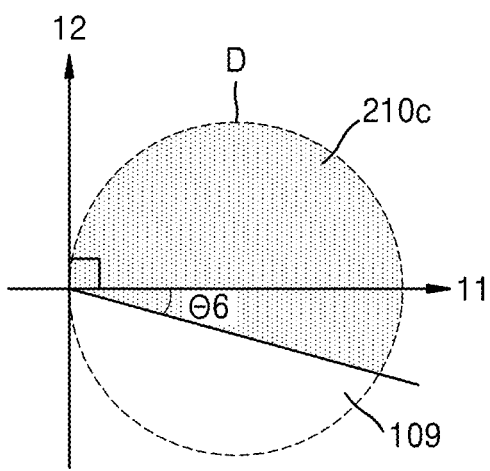

FIG. 10 is a plan view of the display device 1 according to an alternative embodiment, FIG. 11 is a cross-sectional view of the display device 1 according to an embodiment, and FIGS. 12A to 12C are plan views of the display device 1 according to an embodiment.

More specifically, FIG. 10 is an enlarged view of a region A of FIG. 2, FIG. 11 is a cross-sectional view of the display device taken along lines I-I', II-II', and III-III' of FIG. 5, and FIGS. 12A to 12C respectively are enlarged views of regions B, C, and D of FIG. 11.

The embodiments of FIGS. 10 to 12C are substantially the same as the embodiment of FIGS. 5 to 7C except that dummy holes respectively overlapping the red pixel and the blue pixel are provided. The same or like elements shown in FIGS. 10 to 12C have been labeled with the same reference characters as used above to describe the embodiments of the display device shown in FIGS. 5 to 7C, and any repetitive detailed description thereof will hereinafter be omitted or simplified.

Referring to FIGS. 10 to 11, an embodiment of the display device 1 t may include the green pixel Pg, the red pixel Pr, and the blue pixel Pb. In such an embodiment, the green pixel Pg emits light in a green wavelength, the red pixel Pr emits light in a red wavelength, and the blue pixel Pb emits light in a blue wavelength. In an embodiment of FIG. 10, the red pixel Pr and the blue pixel Pb may collectively define the first pixel, and the green pixel Pg may define the second pixel.

The display device 1 may include the first planarization layer 109, the green pixel Pg, and the red pixel Pr. In such an embodiment, the first planarization layer 109 may be arranged over the substrate 100, and the first contact hole 113a, the second contact hole 113b and the dummy hole 114 may be defined through the first planarization layer 109. In such an embodiment, the green pixel Pg may be arranged on the first planarization layer 109 and include the first pixel electrode 210a overlapping the first contact hole 113a and the dummy hole 114, and the red pixel Pr may be arranged on the first planarization layer 109 and include the second pixel electrode 210b overlapping the second contact hole 113b.

In an embodiment, the display device 1 may include the first planarization layer 109, the green pixel Pg and the blue pixel Pb. In such an embodiment, the first planarization layer 109 may be arranged over the substrate 100, and the first contact hole 113a, the second contact hole 113b, the third contact hole 113c, a first dummy hole 114a and a second dummy hole 114b are defined through the first planarization layer 109. In such an embodiment, the green pixel Pg may be arranged on the first planarization layer 109 and include the first pixel electrode 210a overlapping the first contact hole 113a, and the blue pixel Pr include the second pixel electrode 210b and the third pixel electrode 210c. In such an embodiment, the second pixel electrode 210b may be arranged on the first planarization layer 109 and overlap the second contact hole 113b and the first dummy hole 114a, and the third pixel electrode 210c may be arranged on the first planarization layer 109 and overlap the third contact hole 113c and the second dummy hole 114b.

The first planarization layer 109 may be arranged on the source electrode 137 and the drain electrode 138. The first contact hole 113a, the second contact hole 113b, the third contact hole 113c, the first dummy hole 114a, and the second dummy hole 114b may be defined in the first planarization layer 109. The first planarization layer 109 may be a single layer or a multi-layer including an organic material or an inorganic material. In an embodiment, the first planarization layer 109 may include a general-purpose polymer such as BCB, PI, HMDSO, PMMA or PS, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The first planarization layer 109 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). In one embodiment, for example, the first planarization layer 109 may include a siloxane-based polymer material or PI.

The first pixel electrode 210a, the second pixel electrode 210b, and the third pixel electrode 210c may be arranged on the first planarization layer 109. The first pixel electrode 210a, the second pixel electrode 210b, and the third pixel electrode 210c may be apart from each other and disposed in a same layer as each other.

The pixel-defining layer 180 may be arranged on the first planarization layer 109. The pixel-defining layer 180 may overlap the first contact hole 113a, the second contact hole 113b, the third contact hole 113c, the first dummy hole 114a, and the second dummy hole 114b each defined in the first planarization layer 109 and may be arranged on the first planarization layer 109.

The second contact hole 113b and the first dummy hole 114a defined in the first planarization layer 109 may be apart from each other with the second opening OP2 of the pixel-defining layer 180 therebetween. The third contact hole 113c and the second dummy hole 114b defined in the first planarization layer 109 may be apart from each other with the third opening OP3 of the pixel-defining layer 180 therebetween. In an embodiment, for example, as shown in FIG. 10, the second contact hole 113b and the first dummy hole 114a may be apart from each other in the y-direction with the second opening OP2 of the pixel-defining layer 180 therebetween. The third contact hole 113c and the second dummy hole 114b may be apart from each other in the y-direction with the third opening OP3 of the pixel-defining layer 180 therebetween.

The first thin film transistor TFT1 may be connected to the first pixel electrode 210a arranged on the first planarization layer 109 through the first contact hole 113a defined in the first planarization layer 109. The second thin film transistor TFT2 may be connected to the second pixel electrode 210b arranged on the first planarization layer 109 through the second contact hole 113b defined in the first planarization layer 109. The third thin film transistor TFT3 may be connected to the third pixel electrode 210c arranged on the first planarization layer 109 through the third contact hole 113c defined in the first planarization layer 109.

In such an embodiment, the planarization layer includes the dummy holes, such that a direction in which the pixel electrode of the green pixel Pg is inclined becomes the same as directions in which the pixel electrodes of the red pixel Pr and the blue pixel Pb are inclined, and thus occurrence of a color band caused by external light reflection may be effectively prevented.

In an embodiment, the first dummy hole 114a and the second dummy hole 114b, the first dummy hole 114a overlapping the second pixel electrode 210b of the red pixel Pr, and the second dummy hole 114b overlapping the third pixel electrode 210c of the blue pixel Pb are defined through the first planarization layer 109 of the display device 1 to make the direction in which the pixel electrode of the green pixel Pg is inclined coincide with the directions in which the pixel electrodes of the red pixel Pr and the blue pixel Pb are inclined.

Referring to FIGS. 12A to 12C, because the first dummy hole 114a and the second dummy hole 114b are defined through the first planarization layer 109, a height of the first planarization layer 109 that neighbors a portion in which the first dummy hole 114a is patterned becomes lower than a height of a portion of the first planarization layer 109 in which the second contact hole 113b is patterned, and a height of the first planarization layer 109 that neighbors a portion in which the second dummy hole 114b is patterned becomes lower than a height of a portion of the first planarization layer 109 in which the third contact hole 113c is patterned, so that the second pixel electrode 210b of the red pixel Pr and the third pixel electrode 210c of the blue pixel Pb are inclined in a same direction as the direction in which the first pixel electrode 210a of the green pixel Pr is inclined. Therefore, occurrence of a color band caused by external light reflection may be effectively prevented.

More specifically, the first pixel electrode 210a of the green pixel Pg may form a fourth slope θ4 to a (−) z-direction with respect to the first axis 11 on the plane including the first axis 11 and the second axis 12, where the first axis 11 extends in the y-direction, and the second axis 12 extends in the z-direction intersecting with the y-direction. The first pixel electrode 210a may be arranged on the first planarization layer 109. The second pixel electrode 210b of the red pixel Pr may form a fifth slope θ5 to the (−) z-direction with respect to the first axis 11 on the plane including the first axis 11 and the second axis 12. The second pixel electrode 210b may be arranged on the first planarization layer 109. The third pixel electrode 210c of the blue pixel Pb may form a sixth slope θ6 to the (−) z-direction with respect to the first axis 11 on the plane including the first axis 11 and the second axis 12. The third pixel electrode 210c may be arranged on the first planarization layer 109. In such an embodiment, the fourth slope angle θ4, the fifth slope angle θ5, and the sixth slope angle θ6 may have an angle in a range from about 0° to about 3°, may have an angle in a range from about 0° to about 2, or may have an angle in a range from about 0° to about 1.5°. Various modifications may be made. In one embodiment, for example, the first slope angle θ1, the second slope angle θ2, and the third slope angle θ3 may have an angle in a range from about 0° to about 1°.

In an embodiment, as described above, the first pixel electrode 210a of the green pixel Pg, the second pixel electrode 210b of the red pixel Pr, and the third pixel electrode 210c of the blue pixel Pb have a slope angle in a same direction (that is, are inclined in the same direction), such that occurrence of a color band caused by external light reflection may be effectively prevented.

Referring back to FIG. 11, the light-blocking layer 510 may overlap the first dummy hole 114a and the second dummy hole 114b defined in the first planarization layer 109. The light-blocking layer 510 may be apart from the first dummy hole 114a by the first distance d1, where the first distance d1 is defined as a shortest distance between an inner surface of the opening (that is, the fourth opening OP4) formed in the light-blocking layer 510 and the first dummy hole 114a defined in the first planarization layer 109. That is, when the first dummy hole 114a and the light-blocking layer 510 are arranged on a same plane, the first dummy hole 114a may be apart from the light-blocking layer 510 by the first distance d1, where the first distance d1 is defined as a shortest distance between an end of the light-blocking layer 510 and the first dummy hole 114a. In such an embodiment, the light-blocking layer 510 may be apart from the second dummy hole 114b by the first distance d1, where the first distance d1 is defined as a shortest distance between an inner surface of the opening (that is, the fourth opening OP4) formed in the light-blocking layer 510 and the second dummy hole 114b defined in the first planarization layer 109. That is, when the second dummy hole 114b and the light-blocking layer 510 are arranged on a same plane, the second dummy hole 114b may be apart from the light-blocking layer 510 by the first distance d1, where the first distance d1 is defined as a shortest distance between an end of the light-blocking layer 510 and the second dummy hole 114b. In an embodiment, the first distance d1 may be about 5 μm or more, about 6 μm or more, or about 7 μm or more. Various modifications may be made. In one embodiment, for example, the first distance d1 may be about 5.5 μm or more.

An embodiment of the display device 1 may include the first pixel and the second pixel. In such an embodiment, the first pixel includes the first pixel electrode, the second pixel includes the second pixel electrode, the first pixel electrode is arranged on the planarization layer and overlaps the first contact hole and the dummy hole, and the second pixel electrode is arranged on the planarization layer and overlaps the second contact hole. In one embodiment, for example, the first pixel may include the red pixel Pr or the blue pixel Pb, and the second pixel may include the green pixel Pg. In such an embodiment, because the first pixel includes the first pixel electrode overlapping the dummy hole, the direction in which the first pixel electrode of the first pixel is inclined becomes the same as the direction in which the second pixel electrode of the second pixel is inclined, and thus occurrence of a color band caused by external light reflection may be effectively prevented.

Figure 13:
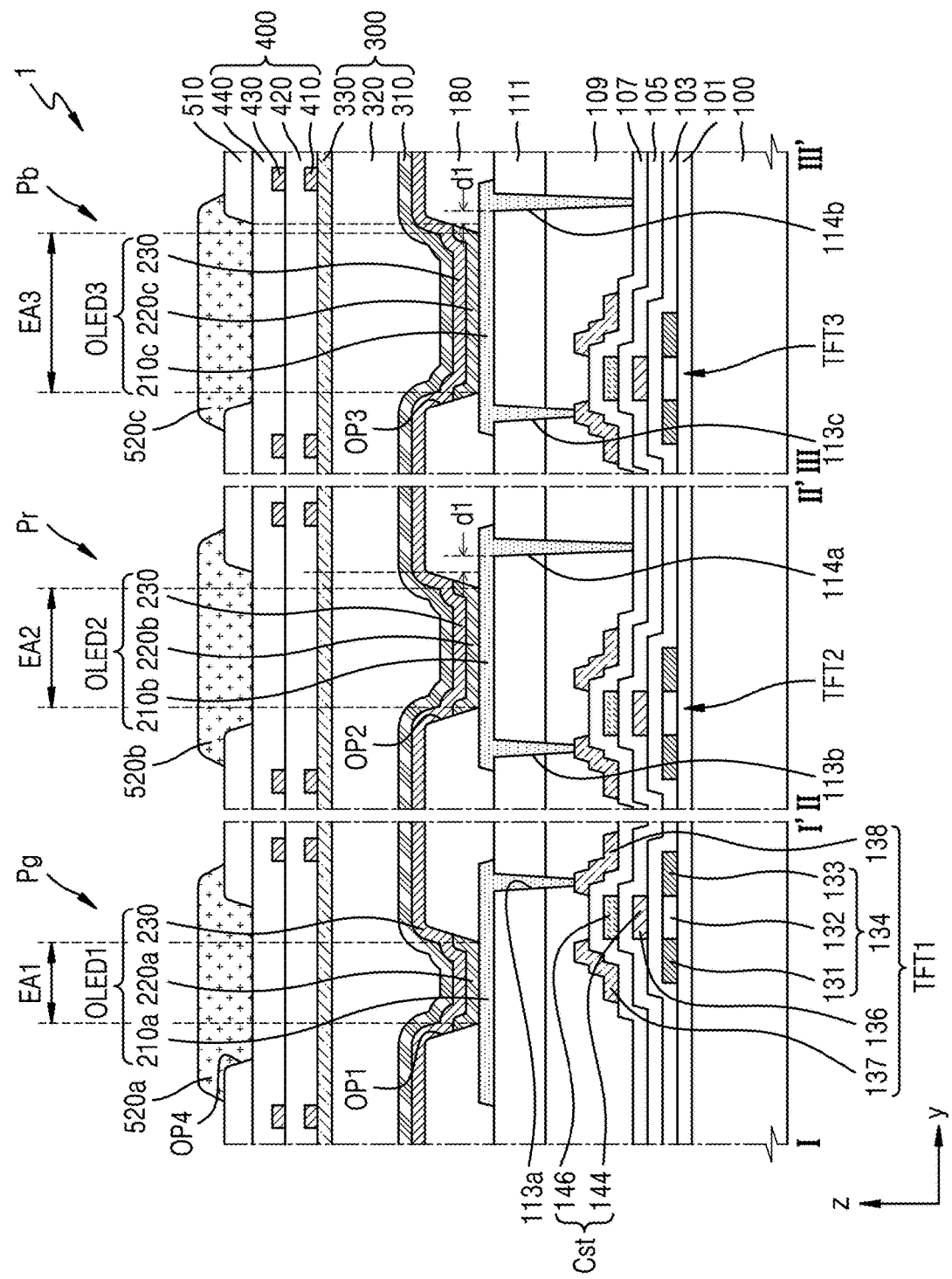
FIGS. 13 and 14 are cross-sectional views of a display device according to alternative embodiments.
Figure 14:
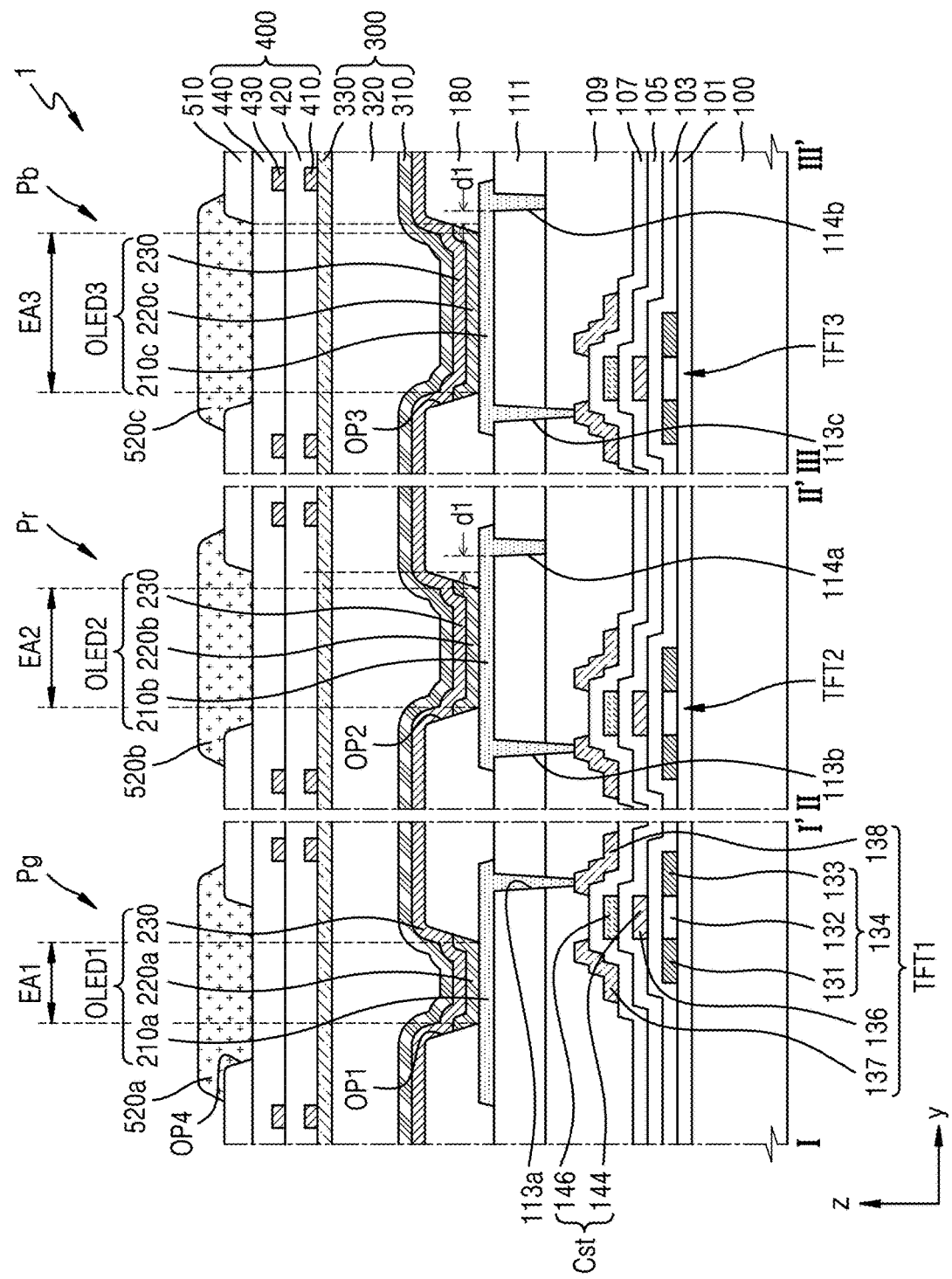

FIGS. 13 and 14 are cross-sectional views of the display device 1 according to alternative embodiments.

The embodiments of FIGS. 13 and 14 are substantially the same as the embodiment of FIG. 11 except that the second planarization layer 111 is provided on the first planarization layer 109. The same or like elements shown in FIGS. 13 and 14 have been labeled with the same reference characters as used above to describe the embodiments of the display device shown in FIG. 11, and any repetitive detailed description thereof will hereinafter be omitted or simplified.

Referring to FIG. 13, an embodiment of the display device 1 may include the first planarization layer 109 and the second planarization layer 111.

The first planarization layer 109 may include a general-purpose polymer such as BCB, PI, HMDSO, PMMA or PS, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the first planarization layer 109 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The second planarization layer 111 may include a general-purpose polymer such as BCB, PI, HMDSO, PMMA or PS, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the second planarization layer 111 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

In an embodiment, the first planarization layer 109 may include a material different from that of the second planarization layer 111. In one embodiment, for example, the first planarization layer 109 may include a siloxane-based polymer material, and the second planarization layer 111 may include PI).

The first planarization layer 109 and the second planarization layer 111 may include a same material as each other. In one embodiment, for example, the first planarization layer 109 may include PI, and the second planarization layer 111 may include Pl.

The first contact hole 113a, the second contact hole 113b, and the third contact hole 113c may be defined in the first planarization layer 109 and the second planarization layer 111. The first thin film transistor TFT1 may be connected to the first pixel electrode 210a of the first organic light-emitting diode OLED1 through the first contact hole 113a defined in the first planarization layer 109 and the second planarization layer 111. The second thin film transistor TFT2 may be connected to the second pixel electrode 210b of the second organic light-emitting diode OLED2 through the second contact hole 113b defined in the first planarization layer 109 and the second planarization layer 111. The third thin film transistor TFT3 may be connected to the third pixel electrode 210c of the third organic light-emitting diode OLED3 through the third contact hole 113c defined in the first planarization layer 109 and the second planarization layer 111.

The first dummy hole 114a may be defined in the first planarization layer 109 and the second planarization layer 111 each overlapping the second pixel electrode 210b. The second dummy hole 114b may be defined in the first planarization layer 109 and the second planarization layer 111 each overlapping the third pixel electrode 210c. In such an embodiment, because the first dummy hole 114a is provided in the first planarization layer 109 and the second planarization layer 111 each overlapping the second pixel electrode 210b and the second dummy hole 114b is provided in the first planarization layer 109 and the second planarization layer 111 each overlapping the third pixel electrode 210c, the directions in which the pixel electrodes of the red pixel Pr and the blue pixel Pb are inclined become the same as the direction in which the pixel electrode of the green pixel Pg is inclined, and thus occurrence of a color band caused by external light reflection may be effectively prevented.

Referring to FIG. 14, an embodiment of the display device 1 may include the first planarization layer 109 and the second planarization layer 111.

The first planarization layer 109 may include a material different from that of the second planarization layer 111. In one embodiment, for example, the first planarization layer 109 may include a siloxane-based polymer material, and the second planarization layer 111 may include Pl.

The first planarization layer 109 and the second planarization layer 111 may include a same material as each other. In one embodiment, for example, the first planarization layer 109 may include PI, and the second planarization layer 111 may include Pl.

The first dummy hole 114a may be defined in the second planarization layer 111 overlapping the second pixel electrode 210b, and the second dummy hole 114b may be defined in the second planarization layer 111 overlapping the third pixel electrode 210c. In such an embodiment, because the first dummy hole 114a is provided in the second planarization layer 111 overlapping the second pixel electrode 210b, and the second dummy hole 114b is provided in the second planarization layer 111 overlapping the third pixel electrode 210c, the directions in which the pixel electrodes of the red pixel Pr and the blue pixel Pb are inclined becomes the same as the direction in which the pixel electrode of the green pixel Pg is inclined, occurrence of a color band caused by external light reflection may be effectively prevented.

In such an embodiment, because the first dummy hole 114a and the second dummy hole 114b are provided in only the second planarization layer 111, the planarization layer may be prevented from being lost and the display device 1 may have a more stable structure.

In a pixel for emitting light in a green wavelength in a plan view, a contact hole is define in a top portion of a pixel electrode, and in a pixel for emitting light in a red wavelength and a pixel for emitting light in a blue wavelength, contact holes are defined in a bottom portion of a pixel electrode, a direction in which the pixel electrode of the pixel emitting light having the green wavelength is inclined is different from directions in which the pixel electrodes of the pixel emitting light having the red wavelength and the pixel emitting light having the blue wavelength are inclined, and thus a color band caused by external light reflection occurs.

In an embodiment of the invention, the dummy hole overlapping the pixel electrode of the pixel emitting light having the green wavelength is patterned in the planarization layer, such that the direction in which the pixel electrode of the pixel emitting light having the green wavelength is inclined becomes the same as the directions in which the pixel electrodes of the pixel emitting light having the red wavelength and the pixel emitting light having the blue wavelength are inclined, and thus occurrence of a color band caused by external light reflection may be effectively prevented.

In an embodiment of the invention, because the dummy holes respectively overlapping the pixel electrode of the pixel for emitting light in the red wavelength and the pixel electrode of the pixel for emitting light in the blue wavelength are patterned in the planarization layer, the directions in which the pixel electrodes of the pixel emitting light having the red wavelength and the pixel emitting light having the blue wavelength are inclined become the same as the direction in which the pixel electrode of the pixel emitting light having the green wavelength is inclined, and thus the display device which may prevent occurrence of a color band caused by external light reflection may be provided.

According to an embodiment, the display device which may reduce the degree of occurrence of a color band caused by external light reflection may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate including a display area and a non-display area outside the display area;
a planarization layer over the substrate, wherein a first contact hole, a second contact hole and a dummy hole are defined through the planarization layer;
a first pixel on the planarization layer and including a first pixel electrode, wherein the first pixel electrode overlaps the first contact hole and the dummy hole, which are apart from each other, and the first pixel electrode is disposed in the first contact hole and the dummy hole; and
a second pixel on the planarization layer and including a second pixel electrode, wherein the second pixel electrode overlaps the second contact hole.

2. The display device of claim 1, wherein the first pixel electrode and the second pixel electrode are inclined in a same direction as each other.

3. The display device of claim 2, further comprising:
a pixel-defining layer on the first pixel electrode, wherein a first opening is defined through the pixel-defining layer to expose at least a portion of the first pixel electrode,
wherein the first contact hole and the dummy hole are apart from each other with the first opening of the pixel-defining layer therebetween.

4. The display device of claim 3, wherein the dummy hole overlaps the pixel-defining layer.

5. The display device of claim 3, wherein the pixel-defining layer includes a light-blocking material.

6. The display device of claim 1, wherein
the planarization layer includes a first planarization layer and a second planarization layer, and
the first contact hole is defined in the first planarization layer and the second planarization layer.

7. The display device of claim 6, wherein the dummy hole is defined in the first planarization layer and the second planarization layer.

8. The display device of claim 6, wherein the dummy hole is defined in only the second planarization layer.

9. The display device of claim 6, wherein the first planarization layer and the second planarization layer include different materials from each other.

10. The display device of claim 1, further comprising:
a first thin film transistor and a second thin film transistor, each of which are over the substrate,
wherein the first thin film transistor is connected to the first pixel electrode through the first contact hole, and
the second thin film transistor is connected to the second pixel electrode through the second contact hole.

11. The display device of claim 1, wherein
the first pixel further includes a first intermediate layer on the first pixel electrode,
the second pixel further includes a second intermediate layer on the second pixel electrode,
one of the first intermediate layer and the second intermediate layer emits light in a green wavelength, and
the other of the first intermediate layer and the second intermediate layer emits light in a red or blue wavelength.

12. The display device of claim 11, wherein
the first intermediate layer emits light in the blue or red wavelength, and
the second intermediate layer emits light in the green wavelength.

13. The display device of claim 3, further comprising:
a light-blocking layer overlapping the pixel-defining layer, wherein a second opening is defined through the light-blocking layer,
wherein the light-blocking layer is apart from the dummy hole by a first distance,
the first distance is defined as a shortest distance between an inner surface of the second opening and the dummy hole.

14. A display device comprising:
a first thin film transistor and a second thin film transistor, each of which is over a substrate;
a planarization layer over the substrate, wherein a first contact hole, a second contact hole and a dummy hole are defined through the planarization layer;
a first pixel electrode on the planarization layer, and connected to the first thin film transistor through the first contact hole, wherein the first pixel electrode overlaps the first contact hole and the dummy hole, which are apart from each other, and the first pixel electrode is disposed in the first contact hole and the dummy hole; and
a second pixel electrode on the planarization layer and connected to the second thin film transistor through the second contact hole.

15. The display device of claim 14, wherein the first pixel electrode and the second pixel electrode are inclined in a same direction as each other.

16. The display device of claim 15, further comprising:
a pixel-defining layer on the first pixel electrode and the second pixel electrode, wherein an opening is defined through the pixel-defining layer to expose at least a portion of the first pixel electrode or the second pixel electrode,
wherein the first contact hole is apart from the dummy hole with the opening of the pixel-defining layer therebetween.

17. The display device of claim 14, wherein
the planarization layer includes a first planarization layer and a second planarization layer, and
the first contact hole is defined in the first planarization layer and the second planarization layer.

18. The display device of claim 17, wherein the dummy hole is defined in the first planarization layer and the second planarization layer.

19. The display device of claim 17, wherein the dummy hole is defined in only the second planarization layer.

20. The display device of claim 14, further comprising:
a first intermediate layer and a second intermediate layer, which are on the first pixel electrode and the second pixel electrode, respectively; and
an opposite electrode covering the first intermediate layer and the second intermediate layer,
wherein one of the first intermediate layer and the second intermediate layer emits light in a green wavelength, and the other of the first intermediate layer and the second intermediate layer emits light in a red or blue wavelength.

\* \* \* \* \*